(12) United States Patent
Horsky et al.

(10) Patent No.: US 8,618,514 B2
(45) Date of Patent: *Dec. 31, 2013

(54) ION IMPLANTATION DEVICE AND A METHOD OF SEMICONDUCTOR MANUFACTURING BY THE IMPLANTATION OF BORON HYDRIDE CLUSTER IONS

(75) Inventors: Thomas N. Horsky, Boxborough, MA (US); Dale C. Jacobson, Salem, NH (US)

(73) Assignee: SemEquip, Inc., North Billerica, MA (US)

( * ) Notice: Subject to any disclaimer, the term of this patent is extended or adjusted under 35 U.S.C. 154(b) by 32 days.

This patent is subject to a terminal disclaimer.

(21) Appl. No.: 13/287,259

(22) Filed: Nov. 2, 2011

(65) Prior Publication Data

US 2012/0076475 A1 Mar. 29, 2012

Related U.S. Application Data

(60) Continuation of application No. 12/268,524, filed on Nov. 11, 2008, now Pat. No. 8,071,958, which is a division of application No. 10/519,699, filed as application No. PCT/US03/20197 on Jun. 26, 2003, now Pat. No. 7,960,709, which is a continuation-in-part of application No. 10/183,768, filed on Jun. 26, 2002, now Pat. No. 6,685,595.

(60) Provisional application No. 60/463,965, filed on Apr. 18, 2003.

(51) Int. Cl.
*H01J 49/10* (2006.01)
*H01J 49/14* (2006.01)
*H01J 27/02* (2006.01)

(52) U.S. Cl.
USPC .................. 250/492.21; 250/492.2; 250/495; 250/423 R; 250/427; 315/111.81; 315/111.91; 118/723 CB; 118/723 R

(58) Field of Classification Search
USPC ............ 250/492.21, 492.2, 425, 423 R, 427; 315/111.81, 111.91; 118/723 CB, 723 R
See application file for complete search history.

(56) References Cited

U.S. PATENT DOCUMENTS

| 3,557,365 A | 1/1971 | Mayo |
| 3,581,195 A | 5/1971 | Jepsen |

(Continued)

FOREIGN PATENT DOCUMENTS

| CN | 1031626 | 3/1989 |
| CN | 1119347 | 3/1996 |

(Continued)

OTHER PUBLICATIONS

Chih-Yuan Lu, et al., "High-Performance Salicide Shallow-Junction CMOS Devices for Submicrometer VLSI Application in Twin-Tub VI," IEEE, vol. 36, No. 11, Nov. 1989.

(Continued)

*Primary Examiner* — Nikita Wells
(74) *Attorney, Agent, or Firm* — John S. Paniaguas; Katten Muchin Rosenman LLP

(57) ABSTRACT

A method of manufacturing a semiconductor device includes the steps of: providing a supply of molecules containing a plurality of dopant atoms into an ionization chamber, ionizing said molecules into dopant cluster ions, extracting and accelerating the dopant cluster ions with an electric field, selecting the desired cluster ions by mass analysis, modifying the final implant energy of the cluster ion through post-analysis ion optics, and implanting the dopant cluster ions into a semiconductor substrate. In general, dopant molecules contain n dopant atoms, where n is an integer number greater than 10. This method enables increasing the dopant dose rate to n times the implantation current with an equivalent per dopant atom energy of 1/n times the cluster implantation energy, while reducing the charge per dopant atom by the factor n.

6 Claims, 36 Drawing Sheets

(56) References Cited

U.S. PATENT DOCUMENTS

| | | |
|---|---|---|
| 3,654,457 A | 4/1972 | Yano et al. |
| 3,908,183 A | 9/1975 | Ennis, Jr. |
| 3,915,757 A | 10/1975 | Engel |
| 4,053,826 A | 10/1977 | Wasawa et al. |
| 4,112,306 A | 9/1978 | Nunan |
| 4,120,700 A | 10/1978 | Morimoto |
| 4,123,686 A | 10/1978 | Keller et al. |
| 4,152,478 A | 5/1979 | Takagi |
| 4,217,855 A | 8/1980 | Takagi |
| 4,326,786 A | 4/1982 | Uchiyama et al. |
| 4,366,459 A | 12/1982 | Vitola |
| 4,412,900 A | 11/1983 | Tanaka et al. |
| 4,587,432 A | 5/1986 | Aitken |
| 4,649,278 A | 3/1987 | Chutjian et al. |
| 4,740,698 A | 4/1988 | Tamura et al. |
| 4,904,902 A | 2/1990 | Tamai et al. |
| 4,937,545 A | 6/1990 | Chaillout et al. |
| 4,943,718 A | 7/1990 | Haines et al. |
| 5,293,508 A | 3/1994 | Shiratake et al. |
| 5,313,061 A | 5/1994 | Drew et al. |
| 5,489,550 A | 2/1996 | Moslehi |
| 5,525,532 A | 6/1996 | Kim |
| 5,528,034 A | 6/1996 | Yamazaki et al. |
| 5,543,625 A | 8/1996 | Johnson et al. |
| 5,561,326 A | 10/1996 | Ito et al. |
| 5,672,879 A | 9/1997 | Glavish |
| 5,686,789 A | 11/1997 | Schoenbach et al. |
| 5,993,766 A | 11/1999 | Tom et al. |
| 5,998,838 A | 12/1999 | Tanabe et al. |
| 6,013,332 A | 1/2000 | Goto et al. |
| 6,013,546 A | 1/2000 | Gardner et al. |
| 6,014,443 A | 1/2000 | Mochizuki et al. |
| 6,093,594 A | 7/2000 | Yeap et al. |
| 6,232,208 B1 | 5/2001 | Wu et al. |
| 6,258,638 B1 | 7/2001 | Tanabe et al. |
| 6,352,626 B1 | 3/2002 | Von Zweck |
| 6,403,956 B1 | 6/2002 | Sinha |
| 6,452,338 B1 | 9/2002 | Horsky |
| 6,489,207 B2 | 12/2002 | Furukawa et al. |
| 6,670,250 B2 | 12/2003 | Lee |
| 6,686,595 B2 | 2/2004 | Horsky |
| 6,703,267 B2 | 3/2004 | Tanabe et al. |
| 6,744,214 B2 | 6/2004 | Horsky |
| 6,812,073 B2 | 11/2004 | Bu et al. |
| 6,830,979 B2 | 12/2004 | Wada |
| 6,893,907 B2 | 5/2005 | Maydan et al. |
| 6,905,947 B2 | 6/2005 | Goldberg |
| 7,023,138 B2 | 4/2006 | Horsky |
| 7,037,813 B2 | 5/2006 | Collins et al. |
| 7,098,099 B1 | 8/2006 | Hornung et al. |
| 7,107,929 B2 * | 9/2006 | Horsky et al. ............ 118/723 CB |
| 7,122,435 B2 | 10/2006 | Chidambaram et al. |
| 7,205,552 B2 | 4/2007 | Goldberg |
| 7,385,208 B2 | 6/2008 | Cheng et al. |
| 7,410,890 B2 | 8/2008 | Kirkpatrick et al. |
| 7,417,241 B2 | 8/2008 | Koezuka et al. |
| 7,491,953 B2 * | 2/2009 | Horsky et al. ............ 250/492.21 |
| 7,518,124 B2 | 4/2009 | Goldberg |
| 7,928,406 B2 | 4/2011 | Horsky et al. |
| 7,960,709 B2 * | 6/2011 | Horsky et al. ............ 250/492.21 |
| 7,994,487 B2 | 8/2011 | Ray |
| 8,071,958 B2 * | 12/2011 | Horsky et al. ............... 250/427 |
| 8,236,675 B2 | 8/2012 | Krull et al. |
| 8,410,459 B2 | 4/2013 | Horsky et al. |
| 2002/0019132 A1 | 2/2002 | Pittaluge et al. |
| 2002/0066901 A1 | 6/2002 | Yamanaka et al. |
| 2002/0070672 A1 | 6/2002 | Horsky |
| 2002/0074521 A1 | 6/2002 | Perel |
| 2003/0001095 A1 | 1/2003 | Lo et al. |
| 2003/0023118 A1 | 1/2003 | Kanayama et al. |
| 2003/0030010 A1 | 2/2003 | Perel et al. |
| 2003/0111014 A1 | 6/2003 | Donatucci et al. |
| 2004/0002202 A1 | 1/2004 | Horsky et al. |
| 2005/0006799 A1 | 1/2005 | Gregg et al. |
| 2005/0169828 A1 | 8/2005 | Spielvogel et al. |
| 2005/0258380 A1 | 11/2005 | White et al. |
| 2005/0274903 A1 | 12/2005 | Goldberg |
| 2006/0097193 A1 | 5/2006 | Horsky et al. |
| 2006/0099812 A1 | 5/2006 | Krull |
| 2006/0144332 A1 | 7/2006 | Sweeney et al. |
| 2007/0023695 A1 | 2/2007 | Cheng et al. |
| 2007/0148888 A1 | 6/2007 | Krull et al. |
| 2007/0178678 A1 | 8/2007 | Hatem et al. |
| 2007/0181830 A1 | 8/2007 | Horsky et al. |
| 2007/0194252 A1 | 8/2007 | Horsky |
| 2008/0122005 A1 | 5/2008 | Horsky et al. |
| 2008/0200020 A1 | 8/2008 | Krull et al. |
| 2008/0305598 A1 | 12/2008 | Horsky et al. |
| 2009/0283695 A1 | 11/2009 | Horsky et al. |
| 2009/0314958 A1 | 12/2009 | Tieger et al. |
| 2010/0107980 A1 | 5/2010 | Horsky et al. |
| 2011/0226969 A1 | 9/2011 | Horsky |

FOREIGN PATENT DOCUMENTS

| | | |
|---|---|---|
| CN | 1248066 | 3/2000 |
| EP | 03762087 | 1/2008 |
| GB | 1258125 | 12/1971 |
| JP | 55093641 | 7/1980 |
| JP | 01225117 | 8/1989 |
| JP | 05314945 | 5/1992 |
| JP | 05-052495 | 12/1993 |
| JP | 08017376 | 1/1996 |
| JP | 08-323065 | 12/1996 |

OTHER PUBLICATIONS

ISR PCT/US03/20197.
Boggia et al., Study of a Trapped Ion Source, IEEE Journal, pp. 1433-1435.
Brautti et al, Trapped Ion Source, IEEE Journal, 1988, pp. 2729-2731.
Chenglu et al., Nuclear Instruments and Methods in Physics Research, 1989, pp. 384-386.
Defino et al., J. Electrochemical Society, vol. 133, No. 9, 1986, pp. 1900-1904.
Jacobson et al., Decaborane, an Alternative Approach to Ultra Low Energy Ion Implementation, IEEE Journal, 2000, pp. 300-303.
Kishimoto, A High-Current Negative-Ion Implanter and its Application for Nanocrystal Fabrication in Insulators, IEEE Journal, 1999, pp. 342-345.
Olsen et al., J. Amer. Chem. Society, vol. 90, No. 15, Jul. 17, 1968, pp. 3946-3951.
Tsubouchi et al., Beam Characterization of Mass-Separated, Low-Energy Positive and Negative Ions deposition Apparatus, IEEE Proc. of the X11th Intl. Conf. on Ion Implantation Technology, Jun. 22-26, 1998, pp. 350-353.
Yamada, Applications of Gas Cluster Ion Beams for Materials Processing.
U.S. Appl. No. 12/268,524, Nov. 11, 2008, Horsky et al.
Goto et al., "Novel Shallow Junction Technology Using Decaborane (B10H14)" Electron Devices Meeting, 1996, Intl San Francisco, CA, USA Dec. 8-11, 1996, NY, NY, USA, IEEE, US, p. 435-438, XP010207579.
Ishikawa et al., "Negative-Ion Implantation Technique" Nuclear Instruments & Methods in Physics Research, Section—B: Beam Interactions With Materials and Atoms Elsevier, Amsterdam, NL, vol. 96, No. ½, Mar. 1995, pp. 7-12, XP004010949.
Takeuchi et al., "Shallow Junction formation by Polyatomic Cluster Ion Implantation," Austin, TX, US Jun. 16-21, 1996, NY, NY USA, IEEE, US p. 772-775, XPO10220650.
Chinese Search Report.

\* cited by examiner

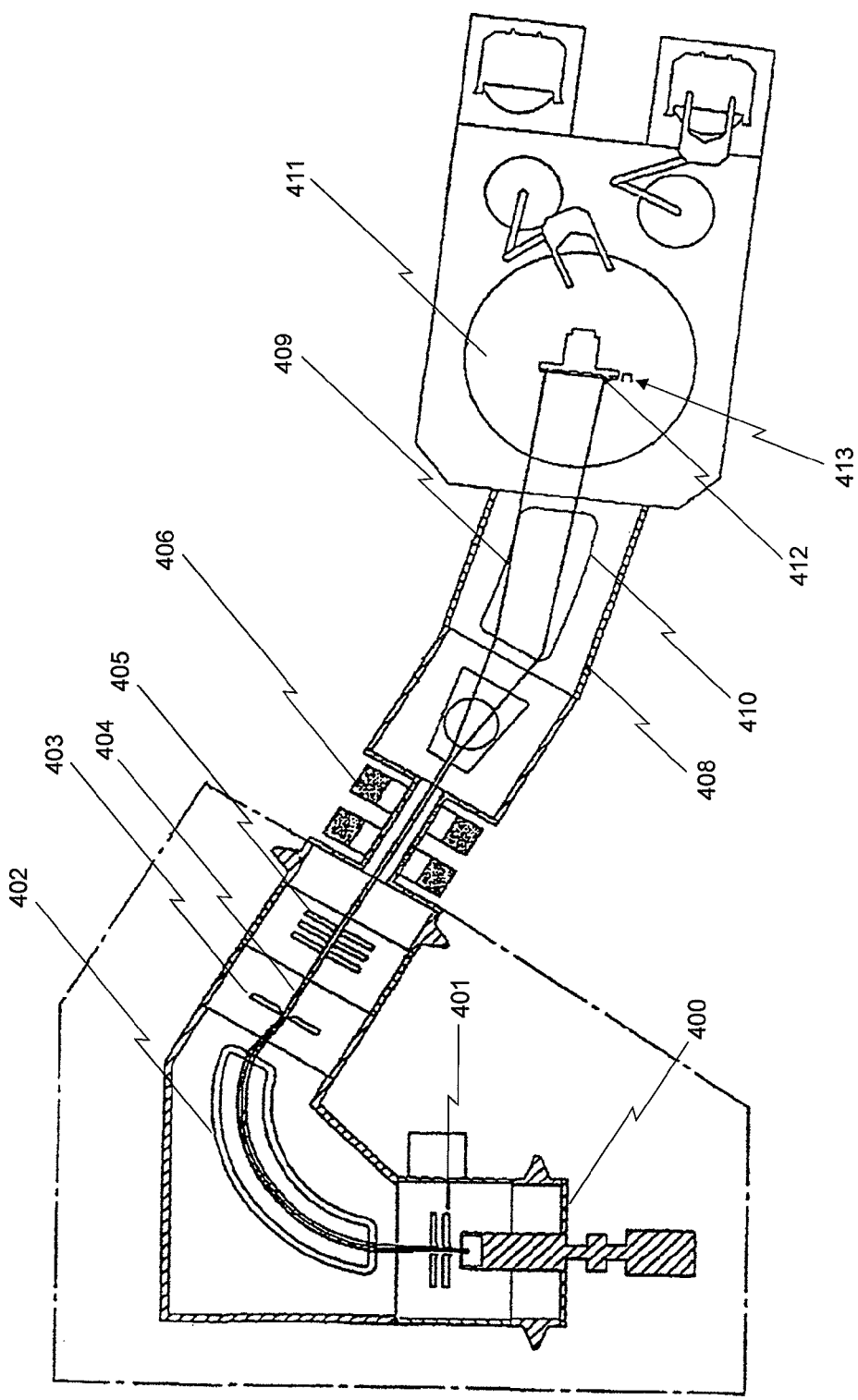

Octadecaborane ($B_{18}H_{22}$) Molecule

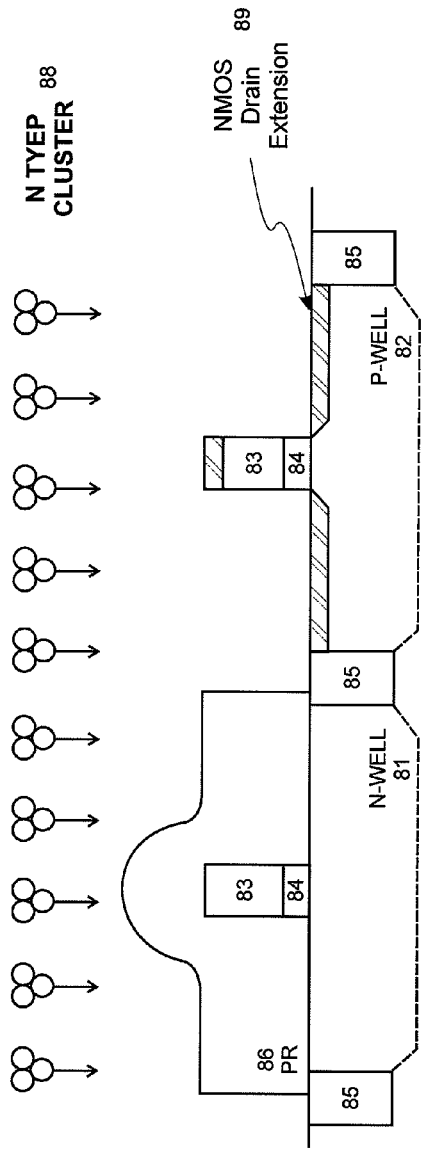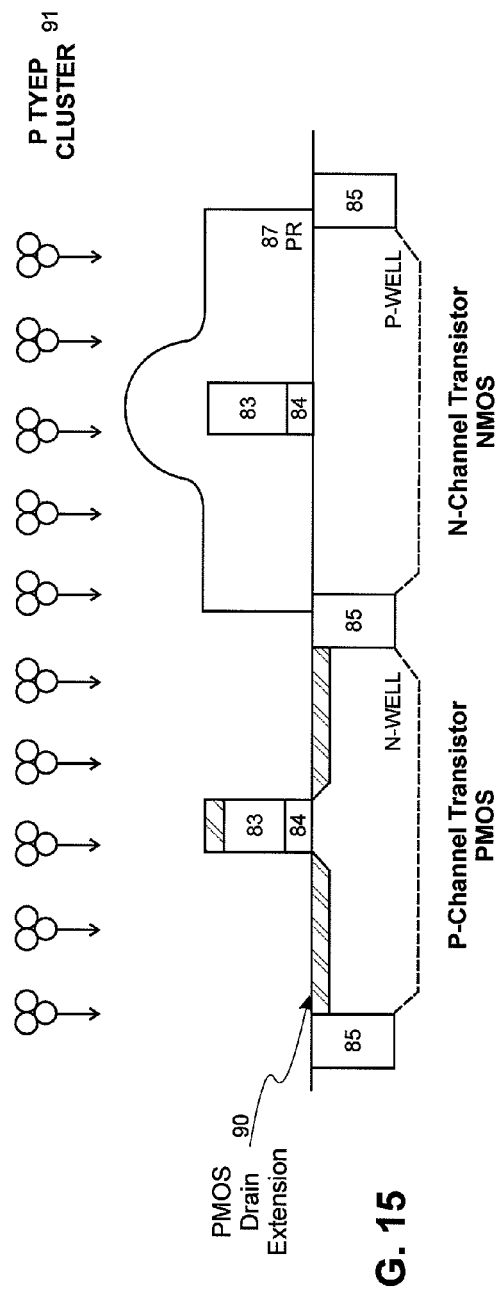
Figs 14, 15: Example of CMOS Fabrication Sequence; 14) NMOS Drain Extension; 15) PMOS Drain Extension

ION IMPLANTATION DEVICE AND A METHOD OF SEMICONDUCTOR MANUFACTURING BY THE IMPLANTATION OF BORON HYDRIDE CLUSTER IONS

CROSS REFERENCE TO RELATED APPLICATIONS

This application is a continuation of U.S. application Ser. No. 12/268,524, filed on filed on Nov. 11, 2008, which, in turn, is a division of U.S. application Ser. No. 10/519,699, filed on Sep. 14, 2005, which is a national stage application under 35 USC §371 of International Application No. PCT/US03/20197, filed on Jun. 26, 2003, which is a continuation-in-part of U.S. patent application Ser. No. 10/183,768, now U.S. Pat. No. 6,686,595. This application also claims priority and the benefit of U.S. Provisional Patent Application No. 60/463,965, filed on Apr. 18, 2003, entitled "An Ion Implantation Device and Method of Semiconductor Manufacturing by the Implantation of Boron Hydride Cluster Ions" and U.S. application Ser. No. 10/183,768, filed on Jun. 26, 2002, entitled Electron Impact Ion Source.

BACKGROUND OF THE INVENTION

1. Field of the Invention

The present invention relates to a method of semiconductor manufacturing in which P-type doping is accomplished by the implantation of ion beams formed from ionized boron hydride molecules, said ions being of the form $B_nH_x^+$ and $B_nH_x^-$ where $10 \leq n \leq 100$ and $0 \leq x \leq n+4$.

2. Description of the Prior Art

The Ion Implantation Process

The fabrication of semiconductor devices involves, in part, the introduction of impurities into the semiconductor substrate to form doped regions. The impurity elements are selected to bond appropriately with the semiconductor material so as to create electrical carriers, thus altering the electrical conductivity of the semiconductor material. The electrical carriers can either be electrons (generated by N-type dopants) or holes (generated by P-type dopants). The concentration of dopant impurities so introduced determines the electrical conductivity of the resultant region. Many such N- and P-type impurity regions must be created to form transistor structures, isolation structures and other such electronic structures which function collectively as a semiconductor device.

The conventional method of introducing dopants into a semiconductor substrate is by ion implantation. In ion implantation, a feed material containing the desired element is introduced into an ion source and energy is introduced to ionize the feed material, creating ions which contain the dopant element (for example, in silicon the elements $^{75}$As, $^{31}$P, and $^{121}$Sb are donors or N-type dopants, while $^{11}$B and $^{115}$In are acceptors or P-type dopants). An accelerating electric field is provided to extract and accelerate the typically positively-charged ions, thus creating an ion beam (in certain cases, negatively-charged ions may be used instead). Then, mass analysis is used to select the species to be implanted, as is known in the art, and the mass-analyzed ion beam may subsequently pass through ion optics which alter its final velocity or change its spatial distribution prior to being directed into a semiconductor substrate or workpiece. The accelerated ions possess a well-defined kinetic energy which allows the ions to penetrate the target to a well-defined, pre-determined depth at each energy value. Both the energy and mass of the ions determine their depth of penetration into the target, with higher energy and/or lower mass ions allowing deeper penetration into the target due to their greater velocity. The ion implantation system is constructed to carefully control the critical variables in the implantation process, such as the ion energy, ion mass, ion beam current (electrical charge per unit time), and ion dose at the target (total number of ions per unit area that penetrate into the target). Further, beam angular divergence (the variation in the angles at which the ions strike the substrate) and beam spatial uniformity and extent must also be controlled in order to preserve semiconductor device yields.

A key process of semiconductor manufacturing is the creation of P-N junctions within the semiconductor substrate. This requires the formation of adjacent regions of P-type and N-type doping. An important example of the formation of such a junction is the implantation of P-type dopant into a semiconductor region already containing a uniform distribution of N-type dopant. In this case, an important parameter is the junction depth, which is defined as the depth from the semiconductor surface at which the P-type and N-type dopants have equal concentrations. This junction depth is a function of the implanted dopant mass, energy and dose.

An important aspect of modern semiconductor technology is the continuous evolution to smaller and faster devices. This process is called scaling. Scaling is driven by continuous advances in lithographic process methods, allowing the definition of smaller and smaller features in the semiconductor substrate which contains the integrated circuits. A generally accepted scaling theory has been developed to guide chip manufacturers in the appropriate resize of all aspects of the semiconductor device design at the same time, i.e., at each technology or scaling node. The greatest impact of scaling on ion implantation process is the scaling of junction depths, which requires increasingly shallow junctions as the device dimensions are decreased. This requirement for increasingly shallow junctions as integrated circuit technology scales translates into the following requirement: ion implantation energies must be reduced with each scaling step. The extremely shallow junctions called for by modern, sub-0.13 micron devices are termed "Ultra-Shallow Junctions", or USJ.

Physical Limitations on Low-Enemy Beam Transport

Due to the aggressive scaling of junction depths in CMOS processing, the ion energy required for many critical implants has decreased to the point that conventional ion implantation systems, originally developed to generate much higher energy beams, deliver much reduced ion currents to the wafer, reducing wafer throughput. The limitations of conventional ion implantation systems at low beam energy are most evident in the extraction of ions from the ion source, and their subsequent transport through the implanter's beam line. Ion extraction is governed by the Child-Langmuir relation, which states that the extracted beam current density is proportional to the extraction voltage (i.e., beam energy at extraction) raised to the 3/2 power. FIG. 2 is a graph of maximum extracted boron beam current versus extraction voltage. For simplicity, an assumption has been made that only $^{11}$B$^+$ ions are present in the extracted beam. FIG. 2 shows that as the energy is reduced, extraction current drops quickly. In a conventional ion implanter, this regime of "extraction-limited" operation is seen at energies less than about 10 keV. Similar constraints affect the transport of the low-energy beam after extraction. A lower energy ion beam travels with a smaller velocity, hence for a given value of beam current the ions are closer together, i.e., the ion density increases. This can be seen from the relation $J=f\eta ev$, where J is the ion beam current density in mA/cm$^2$, $\eta$ is the ion density in ions/cm$^{-3}$, e is the electronic charge ($=6.02\times10^{-19}$ Coulombs), and v is the average ion velocity in cm/s. In addition, since the electrostatic forces between ions are inversely proportional to the square of the distance between them, electrostatic repulsion is much stronger at low energy, resulting in increased dispersion of the ion beam. This phenomenon is called "beam blow-up", and is the principal cause of beam loss in low-energy transport. While low-energy electrons present in the implanter beam line tend to be trapped by the positively-charged ion beam, compensating for space-charge blow-up during transport, blow-up nevertheless still occurs, and is most pronounced in the presence of electrostatic focusing lenses, which tend to strip the loosely-bound, highly mobile compensating electrons from the beam. In particular, severe extraction and transport difficulties exist for light ions, such as the P-type dopant boron, whose mass is only 11 amu. Being light, boron atoms penetrate further into the substrate than other atoms, hence the required implantation energies for boron are lower than for the other implant species. In fact, extremely low implantation energies of less than 1 keV are being required for certain leading edge USJ processes. In reality, most of the ions extracted and transported from a typical $BF_3$ source plasma are not the desired ion $^{11}B^+$, but rather ion fragments such as $^{19}F^+$ and $^{49}BF_2^+$; these serve to increase the charge density and average mass of the extracted ion beam, further increasing space-charge blow-up. For a given beam energy, increased mass results in a greater beam perveance; since heavier ions move more slowly, the ion density η increases for a given beam current, increasing space charge effects in accordance with the discussion above.

Molecular Ion Implantation

One way to overcome the limitations imposed by the Child-Langmuir relation discussed above is to increase the transport energy of the dopant ion by ionizing a molecule containing the dopant of interest, rather than a single dopant atom. In this way, while the kinetic energy of the molecule is higher during transport, upon entering the substrate, the molecule breaks up into its constituent atoms, sharing the energy of the molecule among the individual atoms according to their distribution in mass, so that the dopant atom's implantation energy is much lower than the original transport kinetic energy of the molecular ion. Consider the dopant atom "X" bound to a radical "Y" (disregarding for purposes of discussion the issue of whether "Y" affects the device-forming process). If the ion $XY^+$ were implanted in lieu of $X^+$, then $XY^+$ must be extracted and transported at a higher energy, increased by a factor equal to the mass of XY divided by the mass of X; this ensures that the velocity of X in either case is the same. Since the space-charge effects described by the Child-Langmuir relation discussed above are super-linear with respect to ion energy, the maximum transportable ion current is increased. Historically, the use of polyatomic molecules to ameliorate the problems of low energy implantation is well known in the art. A common example has been the use of the $BF_2^+$ molecular ion for the implantation of low-energy boron, in lieu of $B^+$. This process dissociates $BF_3$ feed gas to the $BF_2^+$ ion for implantation. In this way, the ion mass is increased to 49 AMU, allowing an increase of the extraction and transport energy by more than a factor of 4 (i.e., 49/11) over using single boron atoms. Upon implantation, however, the boron energy is reduced by the same factor of (49/11). It is worthy of note that this approach does not reduce the current density in the beam, since there is only one boron atom per unit charge in the beam. In addition, this process also implants fluorine atoms into the semiconductor substrate along with the boron, an undesirable feature of this technique since fluorine has been known to exhibit adverse effects on the semiconductor device.

Cluster Implantation

In principle, a more effective way to increase dose rate than by the $XY^+$ model discussed above is to implant clusters of dopant atoms, that is, molecular ions of the form $X_nY_m^+$, where n and m are integers and n is greater than one. Recently, there has been seminal work using decaborane as a feed material for ion implantation. The implanted particle was a positive ion of the decaborane molecule, $B_{10}H_{14}$, which contains 10 boron atoms, and is therefore a "cluster" of boron atoms. This technique not only increases the mass of the ion and hence the transport ion energy, but for a given ion current, it substantially increases the implanted dose rate, since the decaborane ion $B_{10}H_x^+$ has ten boron atoms. Importantly, by significantly reducing the electrical current carried in the ion beam (by a factor of 10 in the case of decaborane ions) not only are beam space-charge effects reduced, increasing beam transmission, but wafer charging effects are reduced as well. Since positive ion bombardment is known to reduce device yields by charging the wafer, particularly damaging sensitive gate isolation, such a reduction in electrical current through the use of cluster ion beams is very attractive for USJ device manufacturing, which must increasingly accommodate thinner gate oxides and exceedingly low gate threshold voltages. Thus, there is a critical need to solve two distinct problems facing the semiconductor manufacturing industry today: wafer charging, and low productivity in low-energy ion implantation. As we will show later in this document, the present invention proposes to further increase the benefits of cluster implantation by using significantly larger boron hydride clusters having n>10. In particular, we have implanted the $B_{18}H_x^+$ ion, and further propose to implant the $B_{36}H_x^+$ ion, using the solid feed material octadecaborane, or $B_{18}H_{22}$. We will present first results showing that this technology is a significant advance over previous efforts in boron cluster implantation.

Ion Implantation Systems

Ion implanters have historically been segmented into three basic categories: high current, medium current, and high energy implanters. Cluster beams are useful for high current and medium current implantation processes. In particular, today's high current implanters are primarily used to form the low energy, high dose regions of the transistor such as drain structures and doping of the polysilicon gates. They are typically batch implanters, i.e., processing many wafers mounted on a spinning disk, the ion beam remaining stationary. High current transport systems tend to be simpler than medium current transport systems, and incorporate a large acceptance of the ion beam. At low energies and high currents, prior art implanters produce a beam at the substrate which tends to be large, with a large angular divergence (e.g., a half-angle of up to seven degrees). In contrast, medium current implanters typically incorporate a serial (one wafer at a time) process chamber, which offers a high tilt capability (e.g., up to 60 degrees from the substrate normal). The ion beam is typically electromagnetically or electrodynamically scanned across the wafer at a high frequency, up to about 2 kiloHertz in one dimension (e.g., laterally) and mechanically scanned at a low frequency of less than 1 Hertz in an orthogonal direction (e.g., vertically), to obtain areal coverage and provide dose uniformity over the substrate. Process requirements for medium current implants are more complex than those for high current implants. In order to meet typical commercial implant dose uniformity and repeatability requirements of a variance of only a few percent, the ion beam must possess excellent angular and spatial uniformity (angular uniformity of beam on wafer of ≤1 deg, for example). Because of these requirements, medium current beam lines are engineered to give superior beam control at the expense of reduced acceptance. That is, the transmission efficiency of the ions through the implanter is limited by the emittance of the ion beam. Presently, the generation of higher current (about 1 mA) ion beams at low (<10 keV) energy is problematic in serial implanters, such that wafer throughput is unacceptably low for certain lower energy implants (for example, in the creation of source and drain structures in leading edge CMOS processes). Similar transport problems also exist for batch implanters (processing many wafers mounted on a spinning disk) at the low beam energies of <5 keV per ion.

While it is possible to design beam transport optics which are nearly aberration-free, the ion beam characteristics (spatial extent, spatial uniformity, angular divergence and angular uniformity) are nonetheless largely determined by the emittance properties of the ion source itself (i.e., the beam properties at ion extraction which determine the extent to which the implanter optics can focus and control the beam as emitted from the ion source). The use of cluster beams instead of monomer beams can significantly enhance the emittance of an ion beam by raising the beam transport energy and reducing the electrical current carried by the beam. However, prior art ion sources for ion implantation are not effective at producing or preserving ionized clusters of the required N- and P-type dopants. Thus, there is a need for cluster ion and cluster ion source technology in order to provide a better-focused, more collimated and more tightly controlled ion beam on target, and in addition to provide higher effective dose rates and higher throughputs in semiconductor manufacturing.

An alternative approach to beam line ion implantation for the doping of semiconductors is so-called "plasma immersion". This technique is known by several other names in the semiconductor industry, such as PLAD (PLAsma Doping), PPLAD (Pulsed PLAsma Doping, and PI$^3$ (Plasma Immersion Ion Implantation). Doping using these techniques requires striking a plasma in a large vacuum vessel that has been evacuated and then backfilled with a gas containing the dopant of choice such as boron triflouride, diborane, arsine, or phosphine. The plasma by definition has positive ions, negative ions and electrons in it. The target is then biased negatively thus causing the positive ions in the plasma to be accelerated toward the target. The energy of the ions is described by the equation U=QV, where U is the kinetic energy of the ions, Q is the charge on the ion, and V is the bias on the wafer. With this technique there is no mass analysis. All positive ions in the plasma are accelerated and implanted into the wafer. Therefore extremely clean plasma must be generated. With this technique of doping a plasma of diborane, phosphine or arsine gas is formed, followed by the application of a negative bias on the wafer. The bias can be constant in time, time-varying, or pulsed. Dose can be parametrically controlled by knowing the relationship between pressure of the vapor in the vessel, the temperature, the magnitude of the biasing and the duty cycle of the bias voltage and the ion arrival rate on the target. It is also possible to directly measure the current on the target. While Plasma Doping is considered a new technology in development, it is attractive since it has the potential to reduce the per wafer cost of performing low energy, high dose implants, particularly for large format (e.g., 300 mm) wafers. In general, the wafer throughput of such a system is limited by wafer handling time, which includes evacuating the process chamber and purging and re-introducing the process gas each time a wafer or wafer batch is loader into the process chamber. This requirement has reduced the throughput of Plasma Doping systems to about 100 wafers per hour (WPH), well below the maximum mechanical handling capability of beamline ion implantation systems, which can process over 200 WPH.

Negative Ion Implantation

It has recently been recognized (see, for example, Junzo Ishikawa et al., "Negative-Ion Implantation Technique", Nuclear Instruments and Methods in Physics Research B 96 (1995) 7-12.) that implanting negative ions offers advantages over implanting positive ions. One very important advantage of negative ion implantation is to reduce the ion implantation-induced surface charging of VLSI devices in CMOS manufacturing. In general, the implantation of high currents (on the order of 1 mA or greater) of positive ions creates a positive potential on the gate oxides and other components of the semiconductor device which can easily exceed gate oxide damage thresholds. When a positive ion impacts the surface of a semiconductor device, it not only deposits a net positive charge, but liberates secondary electrons at the same time, multiplying the charging effect. Thus, equipment vendors of ion implantation systems have developed sophisticated charge control devices, so-called electron flood guns, to introduce low-energy electrons into the positively-charged ion beam and onto the surface of the device wafers during the implantation process. Such electron flood systems introduce additional variables into the manufacturing process, and cannot completely eliminate yield losses due to surface charging. As semiconductor devices become smaller and smaller, transistor operating voltages and gate oxide thicknesses become smaller as well, reducing the damage thresholds in semiconductor device manufacturing, further reducing yield. Hence, negative ion implantation potentially offers a substantial improvement in yield over conventional positive ion implantation for many leading-edge processes. Unfortunately, this technology is not yet commercially available, and indeed negative ion implantation has not to the author's knowledge been used to fabricate integrated circuits, even in research and development.

SUMMARY OF THE INVENTION

An object of this invention is to provide a method of manufacturing a semiconductor device, this method being capable of forming ultra-shallow impurity-doped regions of P-type (i.e., acceptor) conductivity in a semiconductor substrate, and furthermore to do so with high productivity.

Another object of this invention is to provide a method of manufacturing a semiconductor device, this method being capable of forming ultra-shallow impurity-doped regions of P-type (i.e., acceptor) conductivity in a semiconductor substrate using ionized clusters of the form $B_nH_x^+$ and $B_nH_x^-$, where 10<n<100 and 0≤x≤n+4.

A further object of this invention is to provide a method of manufacturing a semiconductor device by implanting ionized molecules of octadecaborane, $B_{18}H_{22}$, of the form $B_{18}H_x^+$ or $B_{18}H_x^-$, where x is an integer less than or equal to 22.

A still further object of this invention is to provide for an ion implantation system for manufacturing semiconductor devices, which has been designed to form ultra shallow impurity-doped regions of either N or P conductivity type in a semiconductor substrate through the use of cluster ions.

According to one aspect of this invention, there is provided a method of implanting cluster ions comprising the steps of: providing a supply of molecules which each contain a plurality of dopant atoms into an ionization chamber, ionizing said molecules into dopant cluster ions, extracting and accelerating the dopant cluster ions with an electric field, selecting the desired cluster ions by mass analysis, modifying the final implant energy of the cluster ion through post-analysis ion optics, and implanting the dopant cluster ions into a semiconductor substrate.

An object of this invention is to provide a method that allows the semiconductor device manufacturer to ameliorate the difficulties in extracting low energy ion beams by implanting a cluster of n dopant atoms (n=18 in the case of $B_{18}H_x^+$) rather than implanting a single atom at a time. The cluster ion implant approach provides the equivalent of a much lower energy monatomic implant since each atom of the cluster is implanted with an energy of approximately E/n. Thus, the implanter is operated at an extraction voltage approximately n times higher than the required implant energy, which enables higher ion beam current, particularly at the low implantation energies required by USJ formation. In addition, each milliamp of cluster current provides the equivalent of 18 mA of monomer boron. Considering the ion extraction stage, the relative improvement in transport efficiency enabled by cluster ion implant can be quantified by evaluating the Child-Langmuir limit. It is recognized that this limit can be approximated by:

$$J_{max} = 1.72(Q/A)^{1/2}V^{3/2}d^{-2}, \quad (1)$$

where $J_{max}$ is in mA/cm$^2$, Q is the ion charge state, A is the ion mass in AMU, V is the extraction voltage in kV, and d is the gap width in cm. FIG. 2 is a graph of equation (1) for the case of $^{11}$B+ with d=1.27 cm, where the average mass of the extracted beam is assumed to be 15 AMU. In practice, the extraction optics used by many ion implanters can be made to approach this limit. By extension of equation (1), the following figure of merit, $\Delta$, can be defined to quantify the increase in throughput, or implanted dose rate, for a cluster ion implant relative to monatomic implantation:

$$\Delta = n(U_n/U_1)^{3/2}(m_n/m_1)^{-1/2} \quad (2)$$

Here, $\Delta$ is the relative improvement in dose rate (atoms/sec) achieved by implanting a cluster with n atoms of the dopant of interest at an energy $U_n$ relative to the single atom implant of an atom of mass $m_1$ at energy $U_1$, where $U_1$=eV. In the case where $U_n$ is adjusted to give the same dopant implantation depth as the monatomic (n=1) case, equation (2) reduces to:

$$\Delta = n^2 \quad (3)$$

Thus, the implantation of a cluster of n dopant atoms has the potential to provide a dose rate n$^2$ higher than the conventional implant of single atoms. In the case of $B_{18}H_x$, this maximum dose rate improvement is more than 300. The use of cluster ions for ion implant clearly addresses the transport of low energy (particularly sub-keV) ion beams. It is to be noted that the cluster ion implant process only requires one electrical charge per cluster, rather than having every dopant atom carrying one electrical charge, as in the conventional case. The transport efficiency (beam transmission) is thus improved, since the dispersive Coulomb forces are reduced with a reduction in charge density. Importantly, this feature enables reduced wafer charging, since for a given dose rate, the electrical beam current incident on the wafer is dramatically reduced. Also, since the present invention produces copious amounts of negative ions of boron hydrides, such as $B_{18}H_x^-$, it enables the commercialization of negative ion implantation at high dose rates. Since negative ion implantation produces less wafer charging than positive ion implantation, and since these electrical currents are also much reduced through the use of clusters, yield loss due to wafer charging can be further reduced. Thus, implanting with clusters of n dopant atoms rather than with single atoms ameliorates basic transport problems in low energy ion implantation and enables a dramatically more productive process.

Enablement of this method requires the formation of the cluster ions. The prior art ion sources used in commercial ion implanters produce only a small fraction of primarily lower-order (e.g., n=2) clusters relative to their production of monomers, and hence these implanters cannot effectively realize the low energy cluster beam implantation advantages listed above. Indeed, the intense plasmas provided by many conventional ion sources rather dissociate molecules and clusters into their component elements. The novel ion source described herein produces cluster ions in abundance due to its use of a "soft" ionization process, namely electron-impact ionization. The ion source of the present invention is designed expressly for the purpose of producing and preserving dopant cluster ions. Instead of striking an arc discharge plasma to create ions, the ion source of the present invention uses electron-impact ionization of the process gas by electrons injected in the form of one or more focused electron beams.

DESCRIPTION OF THE DRAWINGS

These and other advantages of the present invention will be readily understood with reference to the following specification and attached drawing wherein:

FIG. 1E is a schematic diagram of an exemplary medium-current cluster ion implantation system in accordance with the present invention.

FIG. 14 is a diagram of a CMOS fabrication sequence during formation of the NMOS drain extension.

FIG. 15 is a diagram of a CMOS fabrication sequence during formation of the PMOS drain extension.

DETAILED DESCRIPTION

Cluster Ion Implantation System

Figure 1A:
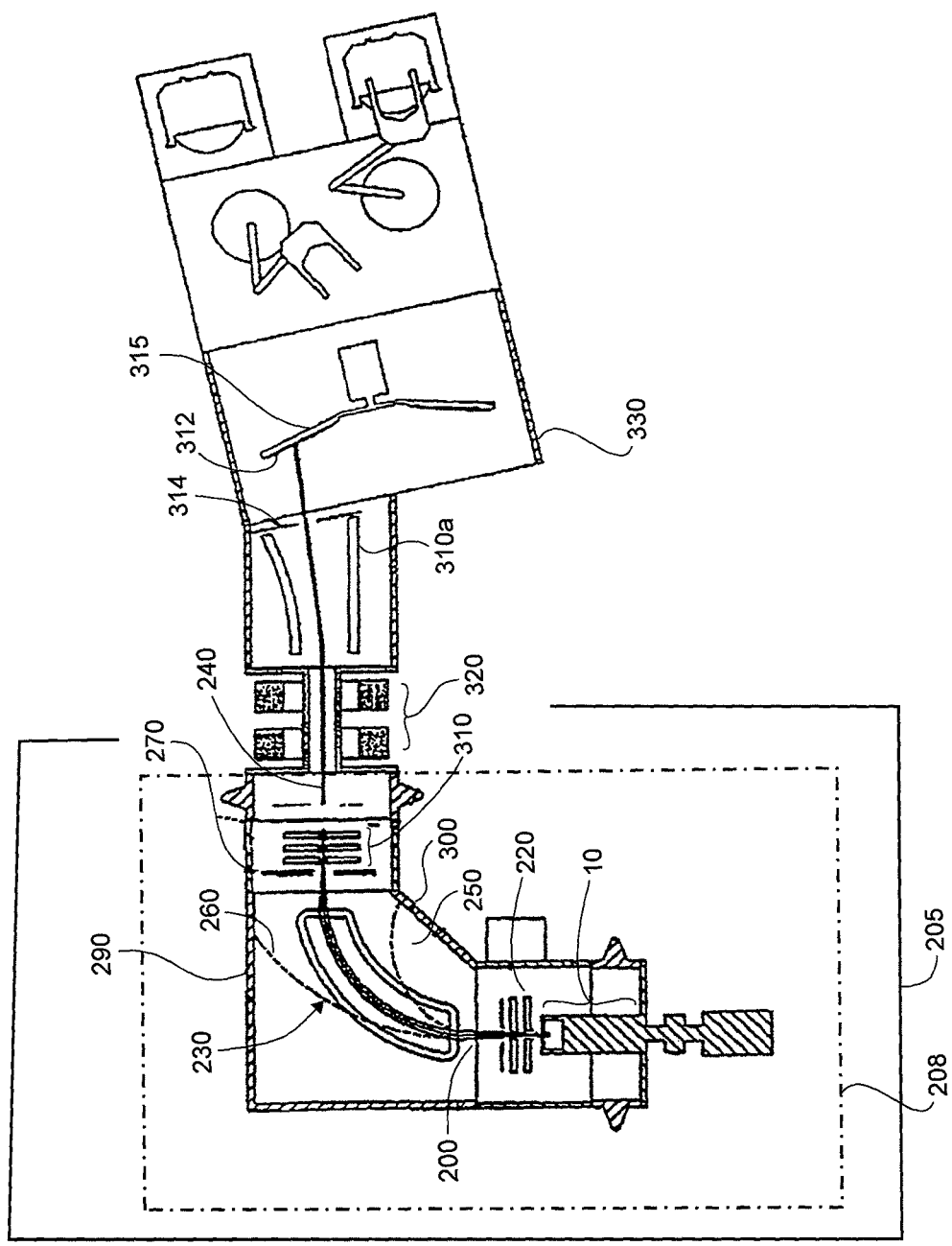
FIG. 1A is a schematic diagram of an exemplary high-current cluster ion implantation system in accordance with the present invention.

FIG. 1A is a schematic diagram of a cluster ion implantation system of the high current type in accordance with the present invention. Configurations other than that shown in FIG. 1A are possible. In general, the electrostatic optics of ion implanters employ slots (apertures displaying a large aspect ratio in one dimension) embedded in electrically conductive plates held at different potentials, which tend to produce ribbon beams, i.e., beams which are extended in one dimension. This approach has proven effective in reducing space-charge forces, and simplifies the ion optics by allowing the separation of focusing elements in the dispersive (short axis) and non-dispersive (long axis) directions. The cluster ion source 10 of the present invention is coupled with an extraction electrode 220 to create an ion beam 200 which contains cluster ions, such as $B_{18}H_x^+$ or $As_4^+$. The ions are extracted from an elongated slot in ion source 10, called the ion extraction aperture, by an extraction electrode 220, which also incorporates slot lenses of somewhat larger dimension than those of the ion extraction aperture; typical dimensions of the ion extraction aperture may be, for example, 50 mm tall by 8 mm wide, but other dimensions are possible. The electrode is an accel-decel electrode in a tetrode configuration, i.e., the electrode extracts ions from the ion source at a higher energy and then decelerates them prior to their exiting the electrode.

Figure 1B:
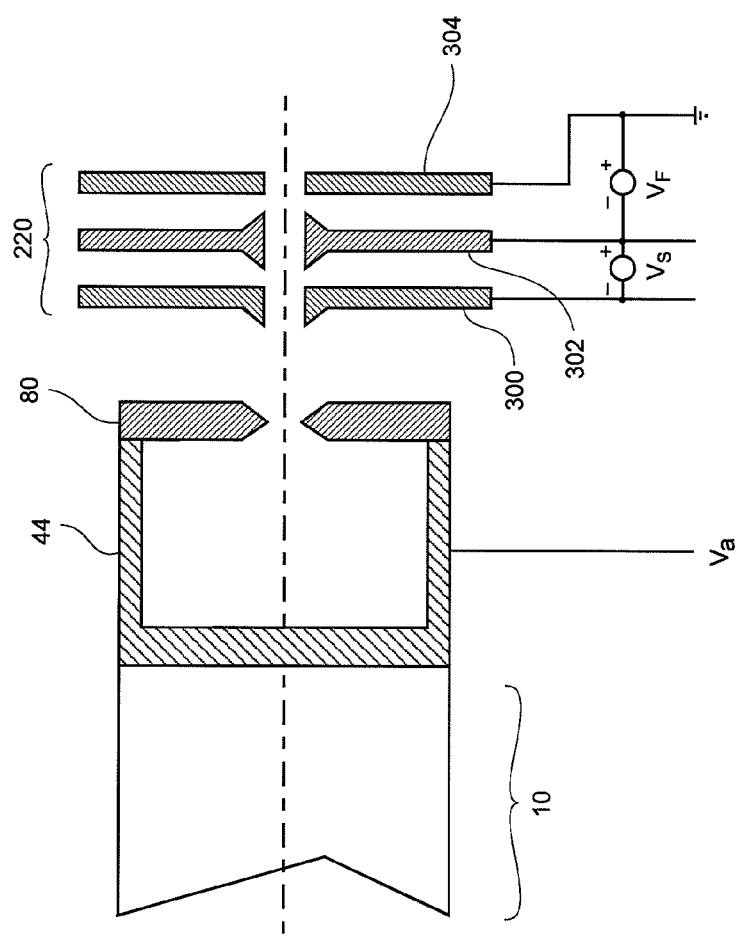
FIG. 1B is a schematic diagram of the accel-decel electrode used in the implantation system of FIG. 1A.

A schematic diagram of the accel-decel electrode is shown in FIG. 1B. It is comprised of suppression plate 300 biased by power supply Vs, extraction plate 302 biased by power supply Vf, and ground plate 304, which is at implanter terminal ground (not necessarily earth ground in a decel machine). Ion extraction aperture plate 80 is held unipotential with ionization chamber 44 of ion source 10, which is held at ion source potential by power supply Va. For the production of positive ions, Va>0, Vf<0, and Vs<0. For production of negative ions, Va<0, Vf=0, and Vs>0. For example, to produce 20 keV positive ions, typical voltages would be Va=20 kV, Vs=−5 kV, Vf=−15 kV. Note that this means that the actual voltages of the various plates are: extraction aperture plate 80=20 kV, suppression plate 300=−20 kV, extraction plate 302=−15 kV, ground plate 304=0V. For producing negative ions, the power supply voltages are reversed. By using bipolar power supplies, either negative or positive ions may be produced by the novel implanter designs of FIG. 1A, 1C, 1D and 1E. Thus, ions are extracted at higher energy from the ion source, and are decelerated upon leaving the ground plate 304, enabling higher extracted currents and improved focusing and transmission of the resultant ion beam 200.

Figure 11A:
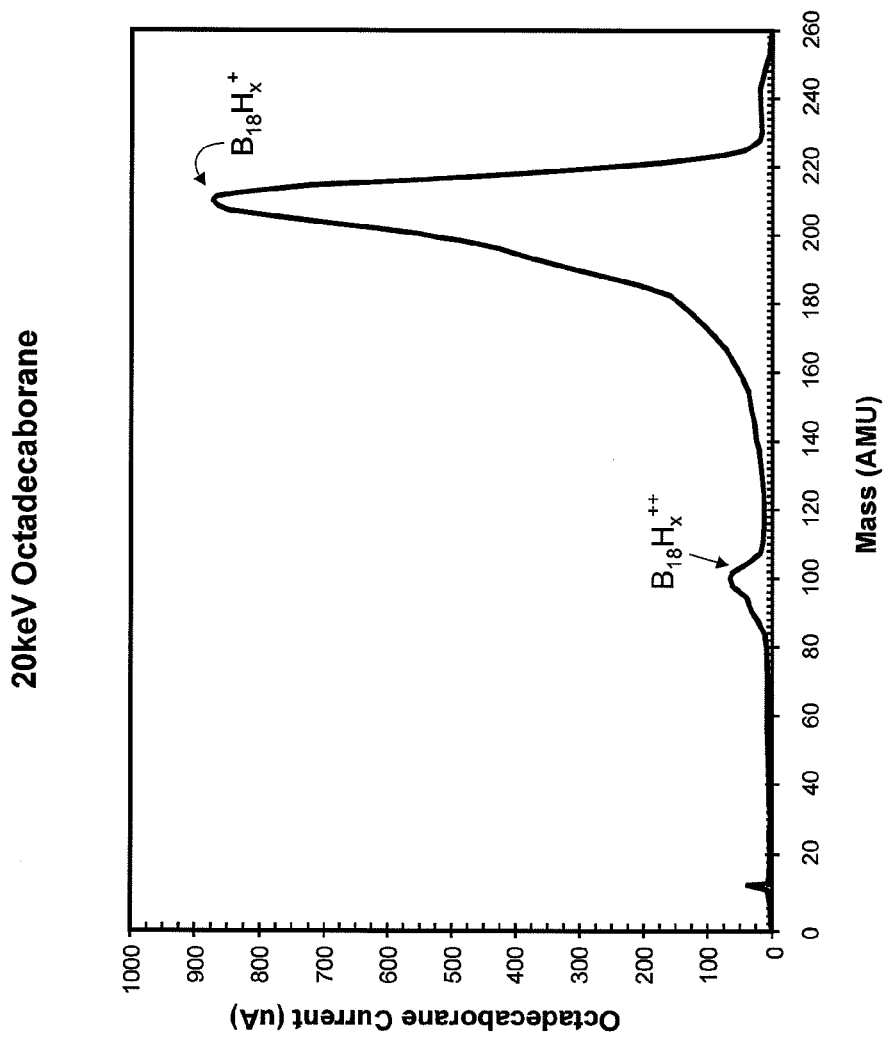
FIG. 11A is a graphical illustration of the positive ion mass spectrum of $B_{18}H_{22}$ generated with the ion source of the present invention, collected at low mass resolution.

The ion beam 200 (FIG. 1A) typically contains ions of many different masses, i.e., all of the ion species of a given charge polarity created in the ion source 210. The ion beam 200 then enters an analyzer magnet 230. The analyzer magnet 230 creates a dipole magnetic field within the ion beam transport path as a function of the current in the magnet coils; the direction of the magnetic field is shown as normal to the plane of FIG. 1A, which is also along the non-dispersive axis of the one-dimensional optics. The analyzer magnet 230 is also a focusing element which forms a real image of the ion extraction aperture (i.e., the optical "object" or source of ions) at the location of the mass resolving aperture 270. Thus, mass resolving aperture 270 has the form of a slot of similar aspect ratio but somewhat larger dimension than the ion extraction aperture. In one embodiment, the width of resolving aperture 270 is continuously variable to allow selection of the mass resolution of the implanter. This feature is important for maximizing delivered beam current of boron hydride cluster ions, which display a number of ion states separated by one AMU, as for example is illustrated in FIG. 11A. A primary function of the analyzer magnet 230 is to spatially separate, or disperse, the ion beam into a set of constituent beamlets by bending the ion beam in an arc whose radius depends on the mass-to-charge ratio of the discrete ions. Such an arc is shown in FIG. 1A as a beam component 240, the selected ion beam. The analyzer magnet 230 bends a given beam along a radius given by Equation (4) below:

$$R=(2mU)^{1/2}/qB, \quad (4)$$

where R is the bending radius, B is the magnetic flux density, m is the ion mass, U is the ion kinetic energy and q is the ion charge state.

The selected ion beam is comprised of ions of a narrow range of mass-energy product only, such that the bending radius of the ion beam by the magnet sends that beam through mass resolving aperture 270. The components of the beam that are not selected do not pass through the mass-resolving aperture 270, but are intercepted elsewhere. For beams with smaller mass-to-charge ratios m/q 250 than the selected beam 240, for example comprised of hydrogen ions having a mass of 1 or 2 AMU, the magnetic field induces a smaller bending radius and the beam intercepts the inner radius wall 300 of the magnet vacuum chamber, or elsewhere upstream of the mass resolving aperture. For beams with larger mass-to-charge ratios 260 than the selected beam 240, the magnetic field induces a larger bending radius, and the beam strikes the outer radius wall 290 of the magnet chamber, or elsewhere upstream of the mass resolving aperture. As is well established in the art, the combination of analyzer magnet 230 and mass resolving aperture 270 form a mass analysis system which selects the ion beam 240 from the multi-species beam 200 extracted from the ion source 10. The selected beam 240 then passes through a post-analysis acceleration/deceleration electrode 310. This stage 310 can adjust the beam energy to the desired final energy value required for the specific implantation process. For example, in low-energy, high-dose process higher currents can be obtained if the ion beam is formed and transported at a higher energy and then decelerated to the desired, lower implant ion energy prior to reaching the wafer. The post-analysis acceleration/deceleration lens 310 is an electrostatic lens similar in construction to decel electrode 220. To produce low-energy positive ion beams, the front portion of the implanter is enclosed by terminal enclosure 208 and floated below earth ground. A grounded Faraday cage 205 surrounds the enclosure 208 for safety reasons. Thus, the ion beam can be transported and mass-analyzed at higher energies, and decelerated prior to reaching the workpiece. Since decel electrode 300 is a strong-focusing optic, dual quadrupoles 320 refocus ion beam 240 to reduce angular divergence and spatial extent. In order to prevent ions which have undergone charge-exchange or neutralization reactions between the resolving aperture and the substrate 312 (and therefore do not possess the correct energy) from propagating to substrate 312, a neutral beam filter 310a (or "energy filter") is incorporated within this beam path. For example, the neutral beam filter 310a shown incorporates a "dogleg" or small-angle deflection in the beam path which the selected ion beam 240 is constrained to follow through an applied DC electromagnetic field; beam components which have become electrically neutral or multiply-charged, however, would necessarily not follow this path. Thus, only the ion of interest and with the correct ion energy is passed downstream of the exit aperture 314 of the filter 310a.

Once the beam is shaped by a quadrupole pair 320 and filtered by a neutral beam filter 310a, the ion beam 240 enters the wafer process chamber 330, also held in a high vacuum environment, where it strikes the substrate 312 which is mounted on a spinning disk 315. Various materials for the substrate are suitable with the present invention, such as silicon, silicon-on-insulator strained superlattice substrate and a silicon germanium (SiGe) strained superlattice substrate. Many substrates may be mounted on the disk so that many substrates may be implanted simultaneously, i.e., in batch mode. In a batch system, spinning of the disk provides mechanical scanning in the radial direction, and either vertical or horizontal scanning of the spinning disk is also effected at the same time, the ion beam remaining stationary.

Figure 1C:
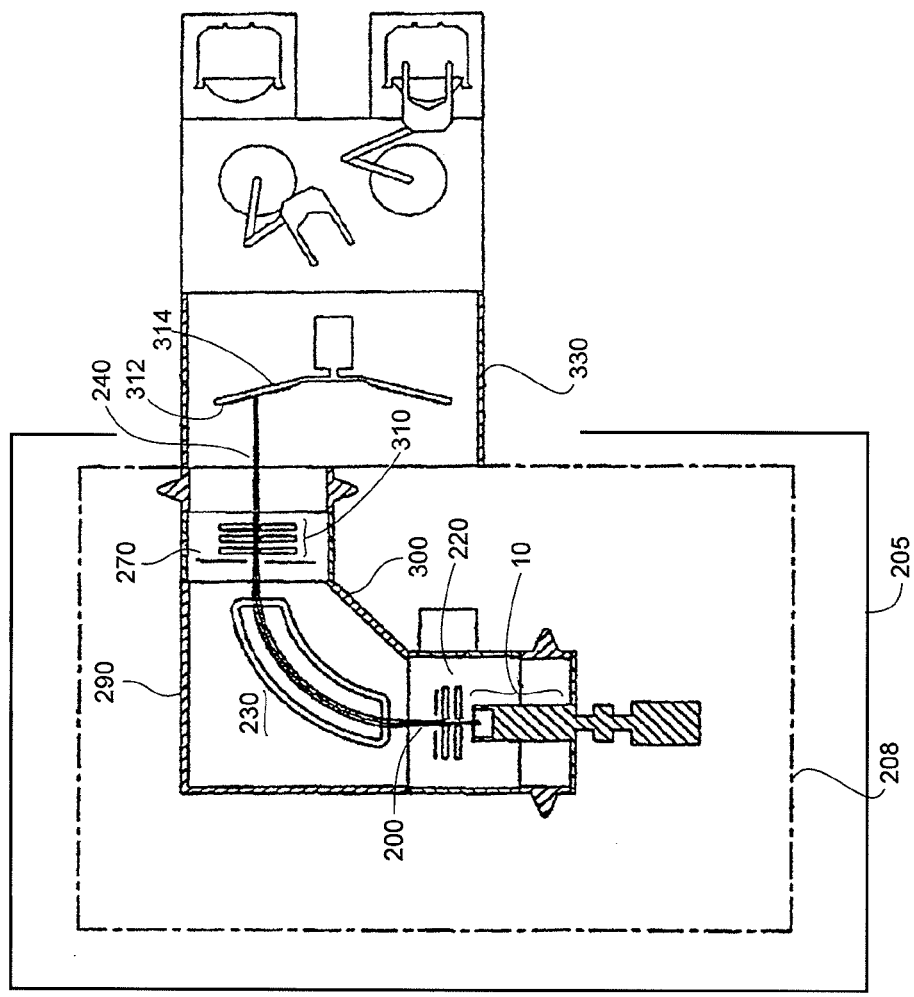
FIG. 1C is an alternative embodiment of a high-current cluster ion implantation system in accordance with the present invention.
Figure 1D:
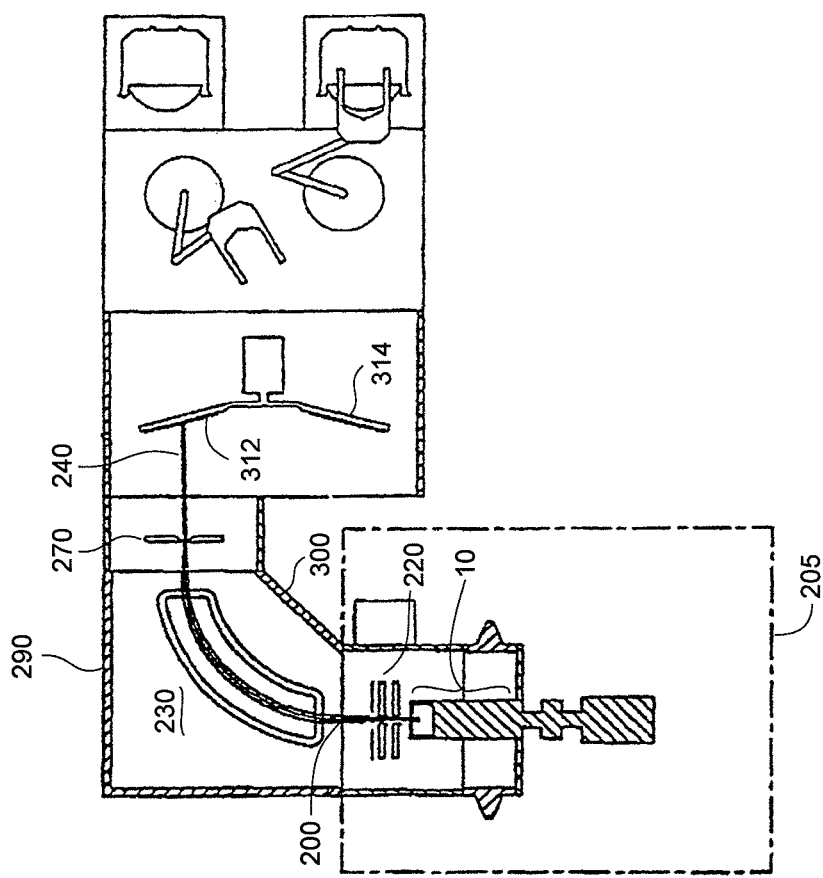
FIG. 1D is yet another alternative embodiment of a high-current cluster ion implantation system in accordance with the present invention.

Alternative embodiments of high-current implanters are illustrated in FIG. 1C and FIG. 1D. In particular, FIG. 1C illustrates an accel-decel implanter similar to that described in FIG. 1A, except that the beam line has been significantly shortened by removal of dual quadrupoles 320 and neutral beam filter 310a. This configuration results in better beam transmission through the implanter, and provides for higher beam currents on substrate 312.

FIG. 1D illustrates a non-accel-decel implanter, i.e., in which the vacuum system of the entire implanter is at earth ground. Thus, in FIG. 1D the decel lens 310 and terminal enclosure 208 are deleted relative to the embodiment shown in FIG. 1C. The method of cluster beam implantation delivers very high effective dopant beam currents at sub-keV energies, even without deceleration. The cluster beam implantation system illustrated in FIG. 1D is greatly simplified and more economical to produce. It also has a shorter beam line, thus increasing the transmission of the beam to the substrate 312.

Figure 2:
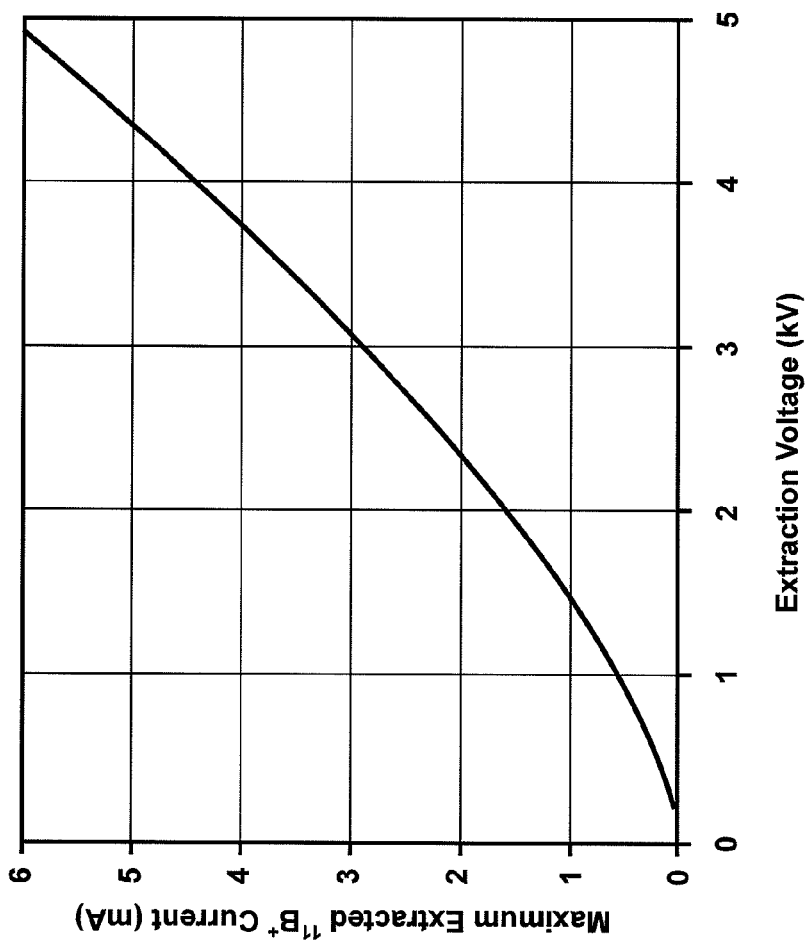
FIG. 2 is a graphical diagram illustrating maximum $^{11}$B$^+$ beam current vs. extraction energy according to the Child-Langmuir Law of equation (1).

FIG. 1E schematically illustrates a proposed medium current implanter which incorporates the present invention. There are many alternative configurations from that which is shown in FIG. 1E. Ion beams typically a few centimeters high and less than one centimeter wide are produced in the ion source 400 extracted by the extraction electrode 401 and transported through the analyzer magnet 402 and mass resolving aperture 403. This produces a beam 404 of a specific mass-energy product. Since the energy is fixed by the extraction voltage, typically a single mass passes through the mass analyzer and resolving aperture at a given analyzer magnet 402 field. Equation (4) above describes this process. The boron hydride cluster ion beam exits the mass resolving aperture and enters the accel-decel electrode 405. This electrode is specifically designed to either add energy to the ion beam or reduce the energy of the ion beam. For low energy implants beam transport is enhanced by extracting the beam at a higher energy and then reducing the energy in the deceleration electrode. The Child-Langmuir Law, as illustrated in FIG. 2, limits the current that can be extracted from the ion source. The $U^{3/2}$ dependence of current density limit on energy, where U is the extraction energy, is responsible for increased current at higher extraction energies. For higher energy implants the accel-decel electrode is used to increase the energy of the ion beam to an energy that is above the extraction energy. Extraction energies are typically 20-40 keV, and can decelerated to less than one keV or accelerated to energies as high as 200 keV for singly charged ions, and as high as 500 keV for multiply charged ions. After acceleration, the beam is transported into a quadrupole lens 406 to refocus the beam after the energy is adjusted by the accel-decel electrode. This step increases the transmission efficiency through the rest of the implanter. If the beam is allow to expand upon leaving the accel-decel region it will hit the walls of beam line and cause particles to be generated by the beam striking the wall of the beam line 408 as well as not being available for implantation into the target. Next the beam encounters the scanning module 407, which scans the beam in one dimension, typically horizontally. The scan frequency is often in the kiloHertz range. This causes the beam to have a very large angular variation, resulting in the beam striking the target at different angles on different parts of the target. To eliminate this scan induced divergence the beam is directed through a beam collimator 410. Beam collimators are either magnetic or electrostatic and yield a wide parallel beam 409. The collimator also removes ions from the beam which are at a different energy than intended, due to charge-exchange reactions encountered in the beam line. Upon exiting the collimator the beam enters the wafer process chamber 411 and strikes the target 412. Medium current implanters usually process one wafer at a time. This is known in the industry as serial processing. Areal coverage of the wafer is accomplished by translating the wafer in a direction orthogonal to the direction of the beam sweep, for example, in the vertical dimension. The frequency of the vertical is very slow compared to the "fast" scan frequency, having a period of 5-10 or more seconds per cycle. The dose (ions/cm$^2$) on the wafer is controlled by monitoring the beam current in a Faraday cup 413 mounted next to the wafer. Once each scan, at the extreme end of the scan, the beam enters the Faraday cup and is monitored. This allows the beam current to be measured at a rate equal to the scan frequency of the beam, for example 1000 times each second. This signal is then used to control the vertical translation speed in the orthogonal direction to beam scan to obtain a uniform dose across the wafer. In addition, the serial process chamber allows for freedom to orient the wafer relative to the ion beam. Wafers can be rotated during the implant process, and can be by tilted to large angles, as much as 60 degrees to the beam normal.

The use of cluster ion beams such as $B_{18}H_x^+$ or $As_4H_x^+$ allow the beam extraction and transmission to take place at higher energies than would be the case for monomers such as $B^+$ or $As^+$. Upon striking the target, the ion energy is partitioned by mass ratio of the individual, constituent atoms. For $B_{18}H_{22}$ the effective boron energy is 10.8/216.4 of the beam energy, because an average boron atom has a mass of 10.8 amu and the molecule has an average mass of 216.4 amu. This allows the beam to be extracted and transported at 20 times the implant energy. Additionally the dose rate is 18 times higher than for a monomer ion. This results in higher throughput and less charging of the wafer. Wafer charging is reduced because there is only one charge for 18 atoms implanted into the wafer instead of one charge for every atom implanted with a monomer beam.

Plasma Doping with Clusters

An alternative approach to beam line ion implantation for the doping of semiconductors is so-called "plasma immersion". This technique is known by several other names in the semiconductor industry, such as PLAD (PLAsma Doping), PPLAD (Pulsed PLAsma Doping, and PI$^3$ (Plasma Immersion Ion Implantation). Doping using these techniques requires striking a plasma in a large vacuum vessel that has been evacuated and then backfilled with a gas containing the dopant of choice such as boron triflouride, diborane, arsine, or phosphine. The plasma by definition has positive ions, negative ions and electrons in it. The target is then biased negatively thus causing the positive ions in the plasma to be accelerated toward the target. The energy of the ions is described by the equation U=QV, where U is the kinetic energy of the ions, Q is the charge on the ion, and V is the bias on the wafer. With this technique there is no mass analysis. All positive ions in the plasma are accelerated and implanted into the wafer. Therefore extremely clean plasma must be generated. With this technique of doping a vapor of boron clusters such as $B_{18}H_{22}$ or arsenic clusters such as $As_4H_x$ can be introduced into the vessel and a plasma ignited, followed by the application of a negative bias on the wafer. The bias can be constant in time, time-varying, or pulsed. The use of these clusters will be beneficial since the ratio of dopant atoms to hydrogen (e.g., using $B_{18}H_{22}$ versus $B_2H_6$ and $As_4H_x$ versus $AsH_3$) is greater for hydride clusters than for simple hydrides, and also the dose rates can be much higher when using clusters. Dose can be parametrically controlled by knowing the relationship between pressure of the vapor in the vessel, the temperature, the magnitude of the biasing and the duty cycle of the bias voltage and the ion arrival rate on the target. It is also possible to directly measure the current on the target. As with beam line implantation, using octadecaborane would yield an 18 times enhancement in dose rate and 20 times higher accelerating voltages required if octadecaborane were the vapor of choice. If $As_4H_x$ were used there would be a four times dose rate enhancement and a four times the voltage required. There would also be reduced changing as with the beam line implants utilizing clusters.

Cluster Ion Source

Figure 3:
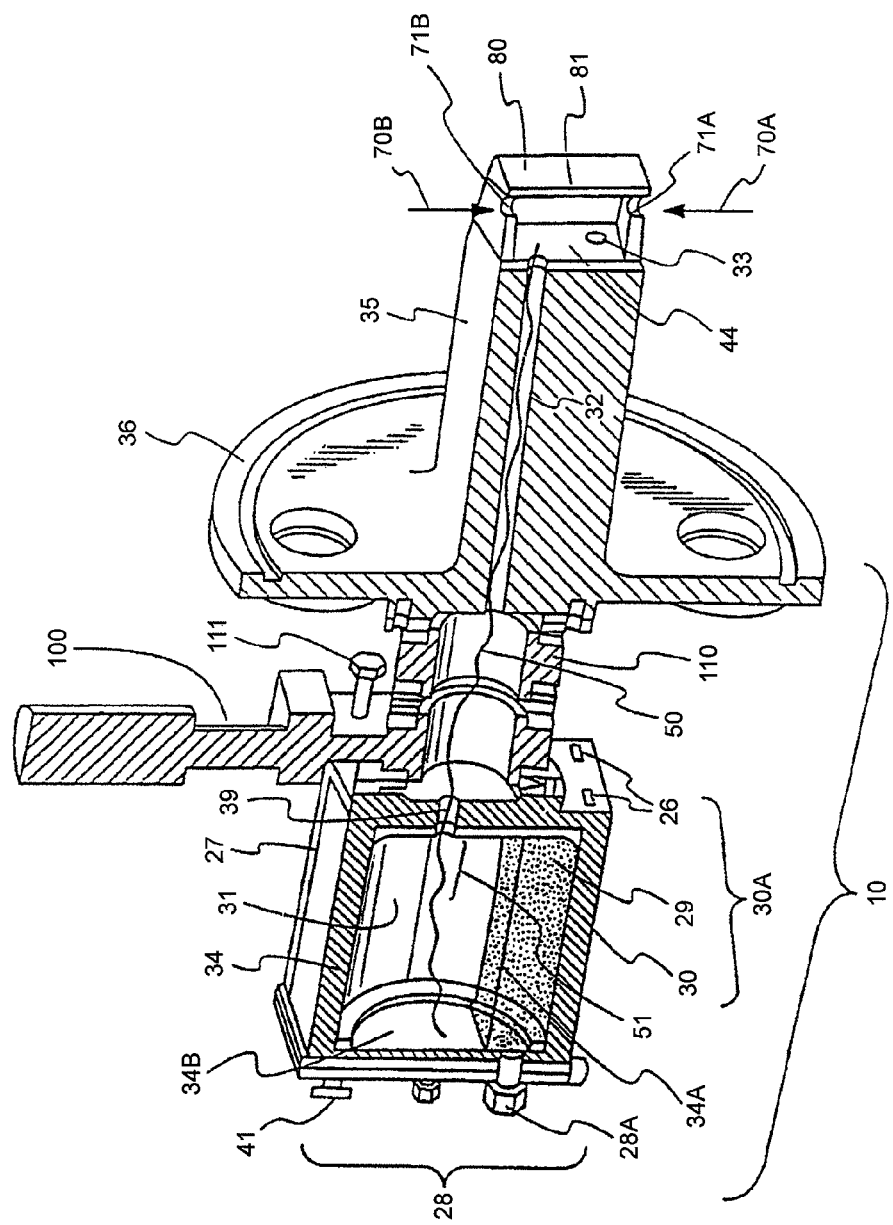
FIG. 3 is a perspective view of an ion source in accordance with the present invention, shown in cutaway to expose internal components.

FIG. 3 is a diagram of a cluster ion source 10 and its various components. The details of its construction, as well as its preferred modes of operation, are disclosed in detail in commonly-owned U.S. patent application Ser. No. 10/183,768, "Electron Impact Ion Source", submitted Jun. 26, 2002, inventor T. N. Horsky, herein incorporated by reference. The ion source 10 is one embodiment of a novel electron•impact ionization source. FIG. 3 is a cross-sectional schematic diagram of the source construction which serves to clarify the functionality of the components which make up the ion source 10. The ion source 10 is made to interface to an evacuated vacuum chamber of an ion implanter or other process tool by way of a mounting flange 36. Thus, the portion of the ion source 10 to the right of flange 36, shown in FIG. 3, is at high vacuum (pressure <1×10$^{-4}$ Torr). Gaseous material is introduced into ionization chamber 44 in which the gas molecules are ionized by electron impact from electron beam 70A or 708, which enters the ionization chamber 44 through electron entrance aperture 718 such that electron beam 70A or 708 is aligned with ion extraction aperture 81, and exits ionization chamber 44 through electron exit aperture 71A. In one embodiment incorporating a single electron gun and a beam dump, shown in FIG. 4A and FIG. 5A, after leaving ionization chamber 44, the electron beam is stopped by beam dump 72 located external to ionization chamber 44. Thus, ions are created adjacent to the ion extraction aperture 81, which appears as a slot in the ion extraction aperture plate 80. The ions are then extracted and formed into an energetic ion beam by an extraction electrode (not shown) located in front of the ion extraction aperture plate 80. The ionization region is shown in more detail in FIGS. 4A and 48 and in FIGS. 5A and 58.

Referring now to FIG. 3, gases may be fed into the ionization chamber 44 via a gas conduit 33. Solid feed materials can be vaporized in a vaporizer 28, and the vapor fed into the ionization chamber 44 through a vapor conduit 32 within the source block 35. Solid feed material 29, located under a perforated separation barrier 34a, is held at a uniform temperature by temperature control of the vaporizer housing 30. Vapor 50 which accumulates in a ballast volume 31 feeds through conduit 39 and through one or more shutoff valves 100 and 110. The nominal pressure of vapor 50 within shutoff valve 110 is monitored by capacitance manometer gauge 60. The vapor 50 feeds into the ionization chamber 44 through a vapor conduit 32, located in the source block 35. Thus, both gaseous and solid dopant-bearing materials may be ionized by this ion source.

Figure 4A:
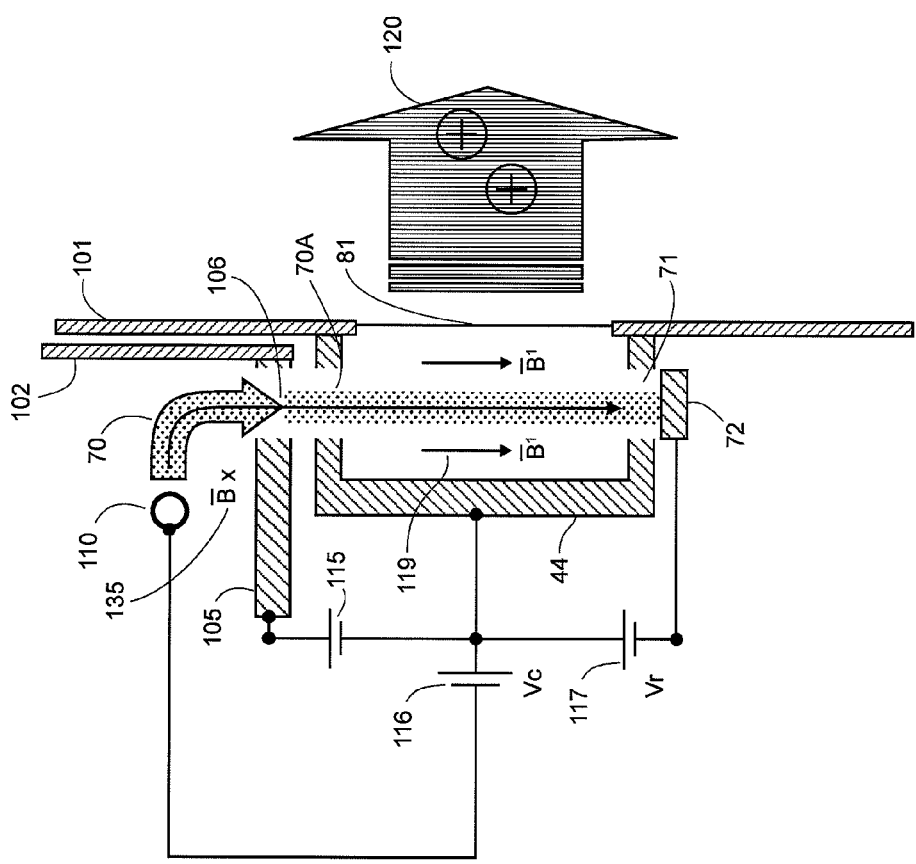
FIG. 4A is a side view of a portion of one embodiment of the ion source shown in FIG. 3, shown in cutaway with the electron beam and magnetic fields shown superimposed thereupon.
Figure 4B:
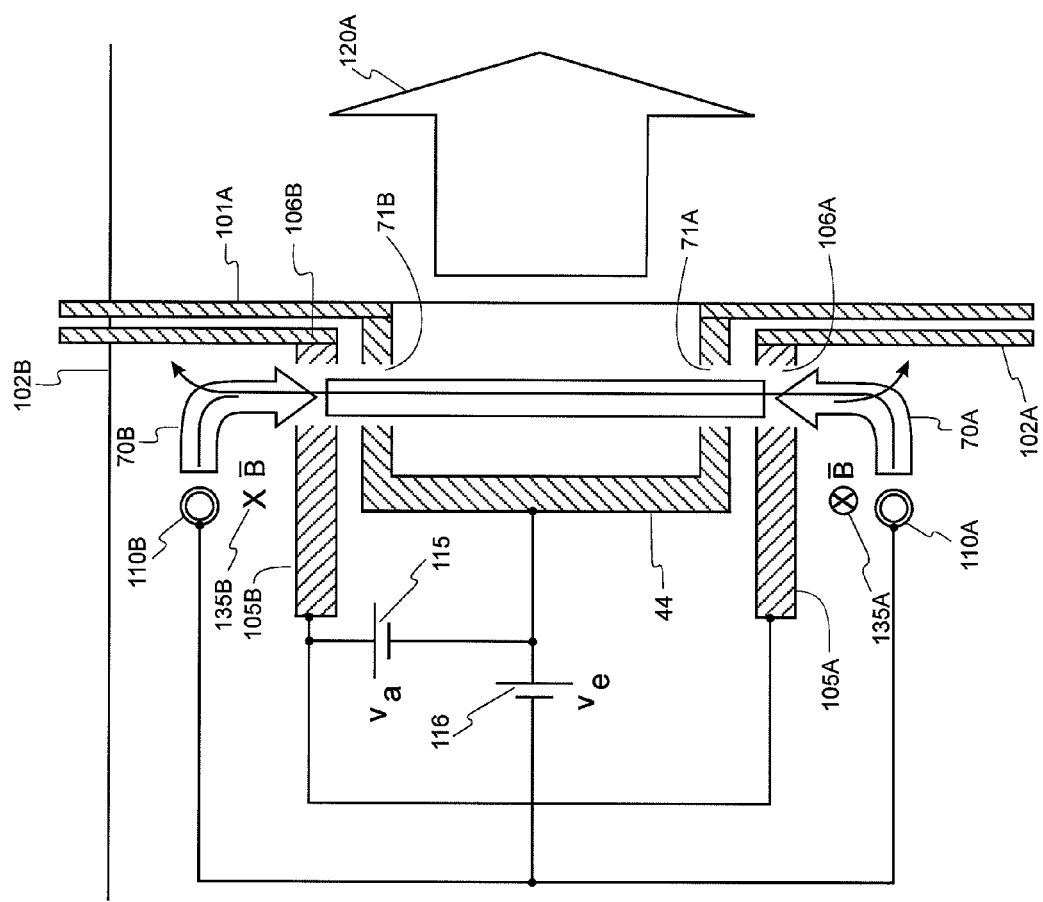
FIG. 4B is similar to FIG. 4A but illustrates an alternative configuration with two electron beam sources.
Figure 5A:
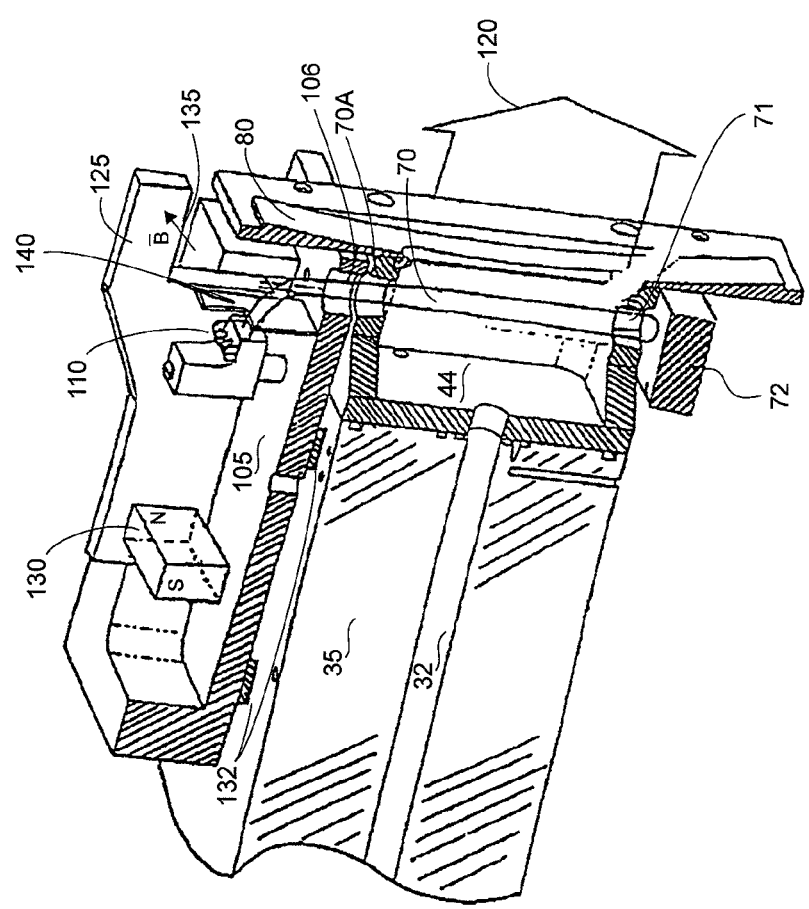
FIG. 5A is a perspective diagram of the cluster ion source of FIG. 3, showing details of the ionization region.
Figure 5B:
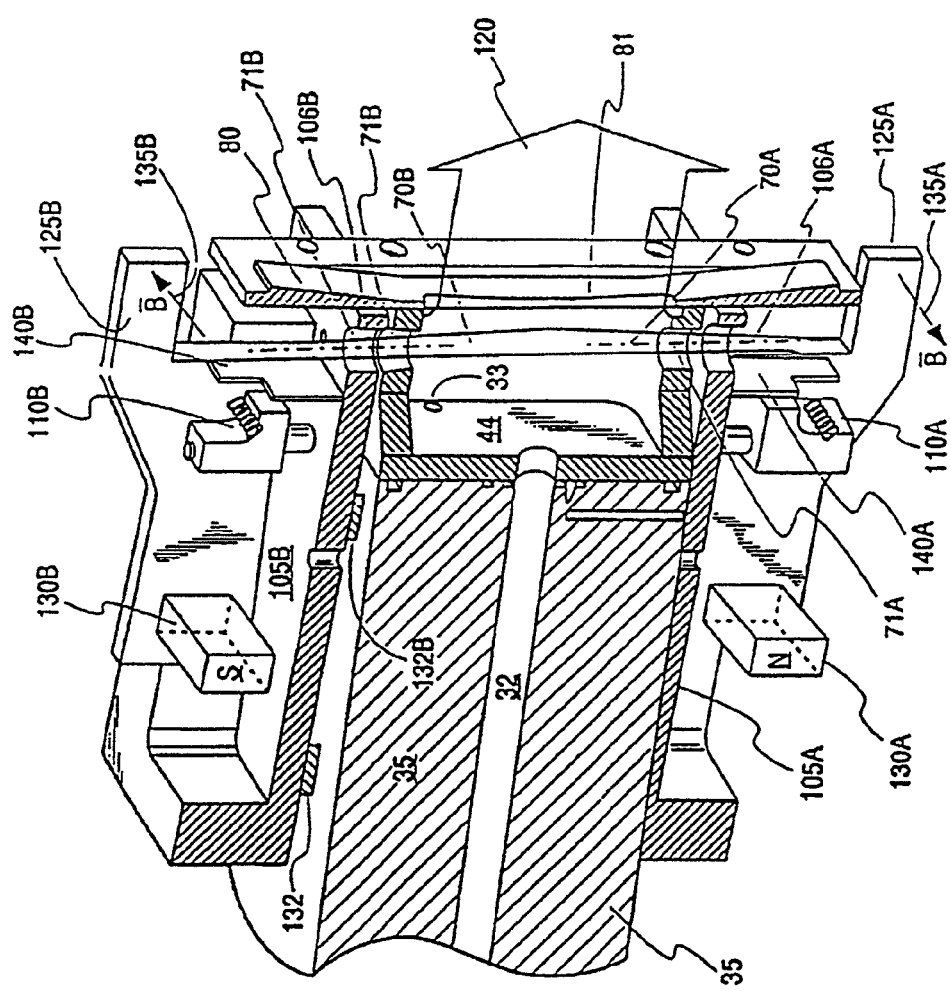
FIG. 5B is similar to FIG. 5A but illustrates an alternative configuration with two electron beam sources.

FIGS. 4A, 4B, 5A and 5B illustrate alternative embodiments of the optical design of the ion source. In particular, FIGS. 4A and 5A illustrate one embodiment of the invention incorporating a single electron source. FIGS. 4B and 5B illustrate an alternative embodiment incorporating dual electron sources.

Single Electron Source

In particular, FIG. 4A is a cross-sectional side view which illustrates one embodiment of the optical design of the ion source configuration in accordance with the present invention. In this embodiment of the invention, an electron beam 70 is emitted from a heated filament 110 and executes a 90 degree trajectory due to the influence of beam steerers, for example, incorporating a static magnetic field B 135 (in a direction normal to the plane of the paper as indicated) into the ionization chamber 44, passing first through base plate aperture 106 in base plate 105, and then through electron entrance aperture 70a in ionization chamber 44. Electrons passing all the way through ionization chamber 44 (i.e., through electron entrance aperture 70a and electron exit aperture 71) are intercepted by a beam dump 72. Emitter shield 102 is unipotential with base plate 105 and provides electrostatic shielding for the propagating electron beam 70. As electron beam 70 propagates through the base plate aperture 106, it is decelerated prior to entering ionization chamber 44 by the application of a voltage Va to base plate 105 (provided by positive-going power supply 115), and voltage Vc to the filament 135 (provided by negative-going power supply 116), both biased relative to the ionization chamber 44. It is important to maintain an electron beam energy significantly higher than typically desired for ionization in the beam-forming and the transport region, i.e., outside of ionization chamber 44. This is due to the space charge effects which severely reduce the beam current and enlarge the electron beam diameter at low energies. Thus, it is desired to maintain the electron beam energy between about 1.5 keV and 5 keV in this region.

Voltages are all relative to the ionization chamber 44. For example, if Vc=−0.5 kV and Va=1.5 kV, the energy of the electron beam is therefore given by e(Va−Vc), where e is the electronic charge ($6.02 \times 10^{-19}$ Coulombs). Thus, in this example, the electron beam 70 is formed and deflected at an energy of 2 keV, but upon entering electron entrance aperture 70a, it has an energy of only 0.5 keV.

Other elements shown in FIG. 4A include an extracted ion beam 120, a source electrostatic shield 101, and emitter shield 102. Emitter shields 102 shields the electron beams 70 from fields associated with the potential difference between base plate 105 and the source shield 101, which is unipotential with ionization chamber 44. The source shield 101 shields the ion beam 120 from fields generated by the potential difference between base plate 105 and ionization chamber 44, and also acts to absorb stray electrons and ions which may otherwise impact the ion source elements. For this reason, emitter shields 102 and the source shield 101 are constructed of refractory metal, such as molybdenum. Alternatively, more complete shielding of the ion beam 120 from magnetic fields B 135 and B' 119 may be accomplished by fabricating source shield 101 of a ferromagnetic substance, such as magnetic stainless steel.

FIG. 5A is a cutaway view illustrating the mechanical detail and which shows explicitly how the contents of FIG. 4A are incorporated into the ion source of FIG. 3. Electrons are thermionically emitted from filament 110 and accelerated to anode 140, forming electron beam 70. Since electron beam 70 is generated external to the ionization chamber, the emitter life is extended relative to known configurations, since the emitter is in the low-pressure environment of the implanter vacuum housing in which the ion source resides, and since the emitter is also effectively protected from ion bombardment.

Magnetic flux from permanent magnet 130 and magnetic pole assembly 125 is used to steer the beam by establishing a uniform magnetic field across the air gap between the ends of the magnetic pole assembly 125, wherein the electron beam 70 propagates. The magnetic field B 135 and the electron beam energies of electron beam 70 are matched such that electron beam 70 is deflected through approximately 90 degrees, and passes into ionization chamber 44 as shown. By deflecting electron beam 70 for example, through 90 degrees, no line of sight exists between emitter 110 and ionization chamber 44 which contains the ions, thus preventing bombardment of the emitters by energetic charged particles.

Since Va is positive relative to the ionization chamber 44, electron beam 70 is decelerated as it passes through the gap defined by base plate aperture 106 and electron entrance aperture 70a. Thus, the combination of base plate aperture 106 and electron entrance aperture 70a and the gap between them, forms an electrostatic lens, in this case, a decelerating lens. The use of a decelerating lens allows the ionization energy of the electron beam to be adjusted without substantially affecting the electron beam generation and deflection.

The gap may be established by one or more ceramic spacers 132, which support base plate 105 and act as a stand off from source block 35, which is at ionization chamber potential. The ceramic spacers 132 provide both electrical isolation and mechanical support. Note that for clarity, the emitter shields 102 and the source shield 101 are not shown in FIG. 5A. Also not shown is the magnetic yoke assembly which is shown in FIG. 7A-7H.

Since the electron entrance aperture 106 can limit transmission of electron beam 70, base plate 105 can intercept a significant portion of the energetic electron beam 70. base plate 105 must therefore be either actively cooled, or passively cooled. Active cooling may be accomplished by passing liquid coolant, such as water, through base plate 105, or forcing compressed air to flow through said base plate 105. In an alternative embodiment, passive cooling is accomplished by allowing base plate 105 to reach a temperature whereby they cool through radiation to their surroundings. This steady-state temperature depends on the intercepted beam power, the surface area and emissivity of the base plate, and the temperatures of surrounding components. Allowing the base plate 105 to operate at elevated temperature, for example at 250 C, is advantageous when running condensable gases which can form contaminating and particle-forming films on exposed cold surfaces.

Dual Electron Source

FIG. 48 is an alternative embodiment of the optical design illustrating a dual electron-beam ion source configuration. In this embodiment of the invention, a pair of spatially separate electron beams 70a and 70b are emitted from a pair of spacially separate heated filaments 110a and 110b and execute 90 degree trajectories due to the influence of beam steerers or static magnetic fields B 135a and 135b (in a direction normal to the plane of the paper as indicated) into the ionization chamber 44, passing first through a pair of base plate apertures 106a and 106b and a pair of spaced apart base plates 105a and 105b, and then through a pair of electron entrance apertures 71a and 71b. Electrons passing all the way through the ionization chamber 44 (i.e., through both of the electron entrance apertures 71a and 71b) are bent toward a pair of emitter shields 102a and 102b by the beam steerers, or static magnetic fields 135a and 135b. As the electron beams propagate through the base plate apertures 106a and 106b, they are decelerated prior to entering ionization chamber 44 by the application of a voltage Va to the base plates 105a and 105b (provided by positive-going power supply 115), and voltage Ve to the filaments 135a and 135b (provided by negative-going power supply 116). It is important to maintain electron beam energies significantly higher than typically desired for ionization in the beam-forming and the transport region, i.e., outside of ionization chamber 44. This is due to the space charge effects which severely reduce the beam current and enlarge the electron beam diameter at low energies. Thus, it is desired to maintain the electron beam energies between about 1.5 keV and 5 keV in this region.

Similar to the embodiment for a single electron source, the voltages for a dual electron source are also all relative to the ionization chamber 44. For example, if Ve=−0.5 kV and Va=1.5 kV, the energy of the electron beam is therefore given by e(Va−Ve), where e is the electronic charge ($6.02 \times 10^{-19}$ Coulombs). Thus, in this example, the electron beam 70a, 70b is formed and deflected at an energy of 2 keV, but upon entering electron entrance aperture 71a, 71b it has an energy of only 0.5 keV.

The following table gives approximate values of magnetic field B required to bend an electron beam with energy E through 90 degrees.

TABLE 1

Dependence of Magnetic Field Strength on Electron Energy to Accomplish a 90 Degree Deflection in the Present Invention

| Electron Energy E | Magnetic Field B |
|---|---|
| 1500 eV | 51 G |
| 2000 eV | 59 G |
| 2500 eV | 66 G |

Other elements shown in FIG. 4B include an extracted ion beam 120a, a source electrostatic shield 101a, and a pair of emitter shields 102a and 102b. These emitter shields 102a and 102b serve two purposes: to provide shielding from electromagnetic fields, and to provide shielding from stray electron or ion beams. For example, the emitter shields 102a and 102b shield the electron beams 70a and 70b from fields associated with the potential difference between base plates 105a and 105b and the source shield 101, and also acts as a dump for stray electron beams from the opposing electron emitter. The source shield 101 shields the ion beam 120 from fields generated by the potential difference between base plates 105a and 105b and the ionization chamber 44, and also acts to absorb stray electrons and ions which would otherwise impact the ion source elements. For this reason, both of the emitter shields 102a and 102b, as well as the source shield 101, are constructed of refractory metal, such as molybdenum or graphite. Alternatively, more complete shielding of ion beam 120a from the magnetic fields B 135a and 135b may be accomplished by constructing the source shield 101a of a ferromagnetic substance, such as magnetic stainless steel.

FIG. 5B is a cutaway view illustrating the mechanical detail and which shows explicitly how the contents of FIG. 4B are incorporated into the ion source of FIG. 3. Electrons are thermionically emitted from one or more of the filaments 110a and 110b and accelerated to a pair of corresponding anodes 140a and 140b forming the electron beams 70a and 70b. Such a configuration offers several benefits. First, the filaments 110a and 110b can be operated separately or together. Second, since the electron beams 70a, 70b are generated external to the ionization chamber, the emitter life is extended relative to known configurations, since the emitter is in the low-pressure environment of the implanter vacuum housing in which the ion source resides, and since the emitter is also effectively protected from ion bombardment.

Magnetic flux from a pair of permanent magnets 130a and 130b and a pair of magnetic pole assemblies 125a and 125b is used to form beam steerers used to establish uniform magnetic fields across the air gap between the ends of the magnetic pole assemblies 125a, 125b, wherein the electron beam 70a, 70b propagates. The magnetic fields 135a and 135b and the electron beam energies of electron beams 70a and 70b are matched such that electron beams 70a and 70b are deflected 90 degrees, and pass into the ionization chamber 44 as shown. By deflecting the electron beams 70a and 70b, for example, through 90 degrees, no line of sight exists between the emitters and the ionization chamber 44 which contains the ions, thus preventing bombardment of the emitters by energetic charged particles.

Since Va is positive relative to ionization chamber 44, the electron beams 70A, 70B are decelerated as they pass through the gap defined by base plate apertures 106a and 106b and the electron entrance apertures 71a and 71b. Thus, the combination of base plate aperture 106a and electron entrance aperture 71a, and baseplate aperture 106b and electron entrance aperture 71b, and the gaps between them, each forms an electrostatic lens, in this case, a decelerating lens. The use of the decelerating lens allows the ionization energy of the electron beam to be adjusted without substantially affecting the electron beam generation and deflection.

The gap may be established by one or more ceramic spacers 132a and 132b, which support each base plate 105a and 105b and act as a stand off from the source block 35, which is at ionization chamber potential. The ceramic spacers 132a and 132b provide both electrical isolation arid mechanical support. Note that for clarity, emitter shields 102 and the source shield 101 are not shown in FIG. 3.

Since the electron entrance apertures 106a and 106b can limit transmission of the electron beams, the baseplates 105a and 105b can intercept a portion of the energetic electron beams 70a, 70b. The baseplates 105a, 105b must therefore be either actively cooled, or passively cooled. Active cooling may be accomplished by passing liquid coolant, such as water, through the baseplates. Alternatively, passive cooling may be accomplished by allowing the baseplates to reach a temperature whereby they cool through radiation to their surroundings. This steady-state temperature depends on the intercepted beam power, the surface area and emissivity of the baseplates, and the temperatures of surrounding components. Allowing the baseplates 105a, 105b to operate at elevated temperature, for example at 200 C, may be advantageous when running condensable gases which can form contaminating and particle-forming films on cold surfaces.

Figure 5C:
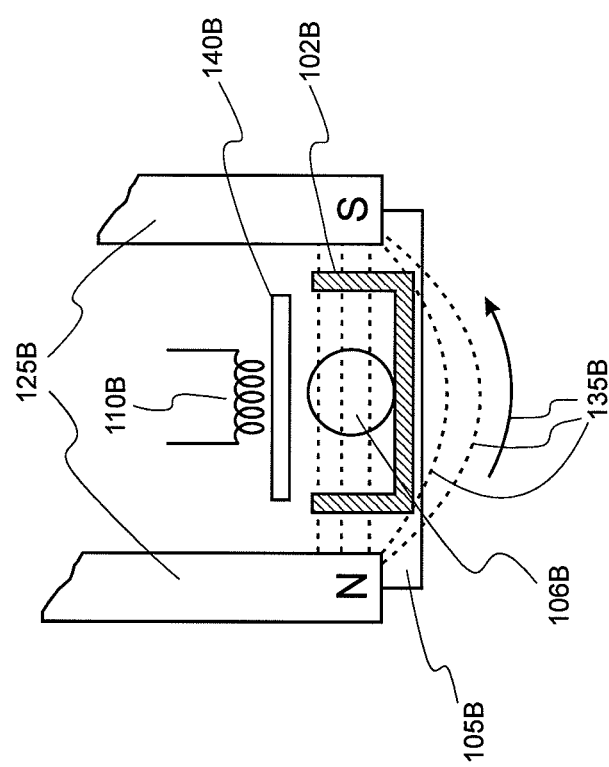
FIG. 5C is a simplified top view of the electron beam forming region of the ion source illustrated in FIG. 5B.

FIG. 5C shows a simplified top view of the electron beam-forming region of the source illustrated in FIGS. 4B and 5B. The filament 110b is at potential Ve, for example, −0.5 keV with respect to ionization chamber 44 (FIG. 3), and the anode 140b, the magnetic pole assembly 125b, base plate 105b, and the emitter shield 102b are all at anode potential Va, for example, 1.5 keV. Thus, the electron beam energy is 2 keV. The electron beam 70b is deflected by magnetic field 135b in the air gap between the poles of the magnetic pole assembly 125b, such that electron beam 70b passes through the base plate aperture 106b. Typical values for the base plate apertures 106a and 106b and the electron entrance apertures 71a and 71b are all 1 cm in diameter, although larger or smaller apertures are possible.

Ionization Probability

Figure 21:
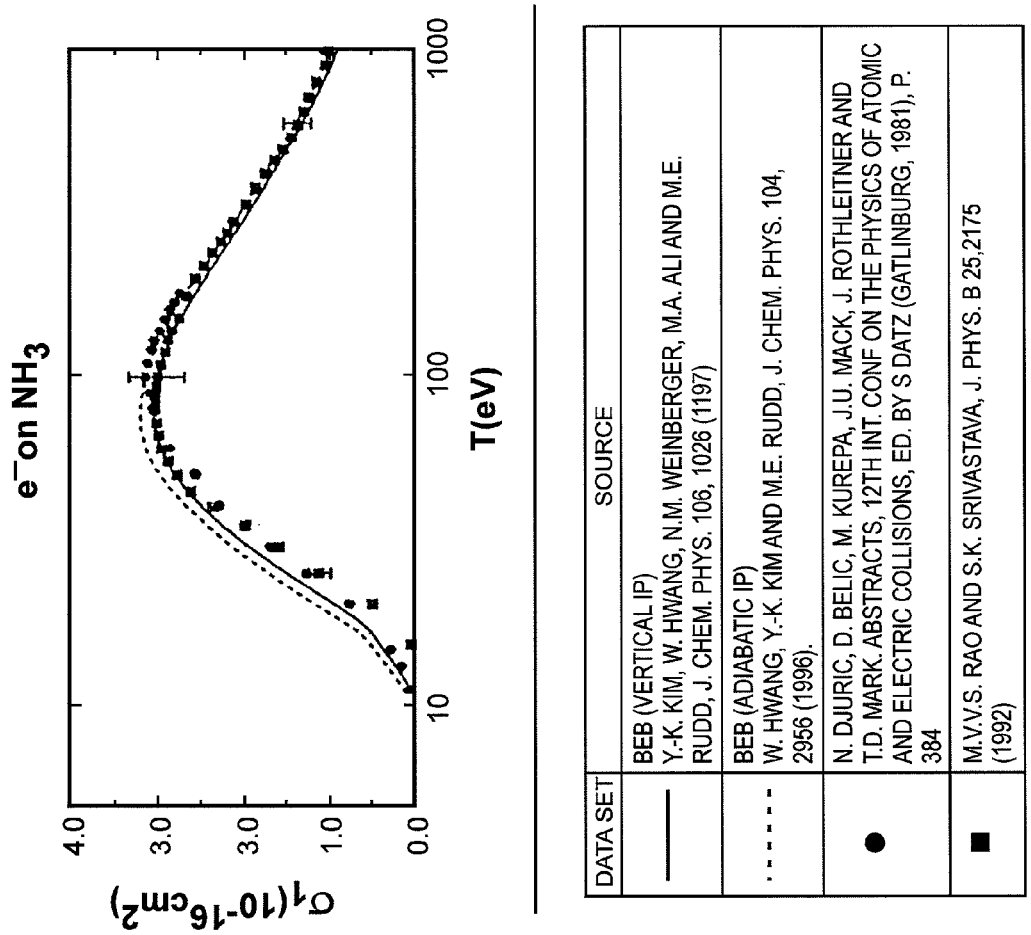
FIG. 21 is a graphical illustration of the ionization cross-section o as a function of electron energy T for ammonia ($NH_3$).

FIG. 21 illustrates how ionization probability depends on the electron energy for electron impact ionization. Ammonia ($NH_3$) is used as an illustration. Probability is expressed as cross section a, in units of $10^{-16}$ cm$^2$. Electron energy (T) is in eV, i.e., electron-volts. Shown are two sets of theoretical curves marked BEB (vertical IP) and BEB (adiabatic IP) calculated from first principles, and two sets of experimental data, from Djuric et al. (1981) and from Rao and Srivastava (1992). FIG. 21 illustrates the fact that certain ranges of electron energies produce more ionization than in other energy ranges. In general, cross sections are highest for electron impact energies between about 50 eV and 500 eV, peaking at about 100 eV. Thus, the energy with which the electron beams enter the ionization. chamber 44 is an important parameter which affects the operation of the ion source of the present invention. The features shown in FIGS. 4A, 4B and FIGS. 5A and 5B show how the present invention incorporates electron optics which allow for broad control of electron impact ionization energy while operating at nearly constant conditions in the electron beam-forming and deflection regions of the ion source.

Temperature Control

One aspect of the ion source of the present invention is user control of the ionization chamber temperature, as well as the temperature of the source block and valves. This feature is advantageous when vaporizing condensable gases, preventing significant coating of surfaces with condensed material, and ensuring efficient transport of the vapor through conduit 39, valves 100, 110, and vapor feed 32. The source utilizes a combination of heating and cooling to achieve accurate control of the source temperature. Separate temperature control is provided for vaporizer 28, shutoff valves 100 and 110, and source block 35. Ionization chamber 44 is passively heated, as is extraction aperture plate 80, by interactions with electron beam 70, and maintains stable operating temperature though thermally conductive interfaces between source block 35 and ionization chamber 44, and between ionization chamber 44 and extraction aperture plate 80, such that source block temp<ionization chamber temp<extraction aperture temp. External electronic controllers (such as an Omron model E5CK) are used for temperature control. Heating is provided by embedded resistive heaters, whose heating current is controlled by the electronic controller. Cooling is provided by a combination of convective and conductive gas cooling methods, as further described, for example, in commonly owned PCT application US01/18822, and in U.S. application Ser. No. 10/183,768, both herein incorporated by reference.

Figure 6:
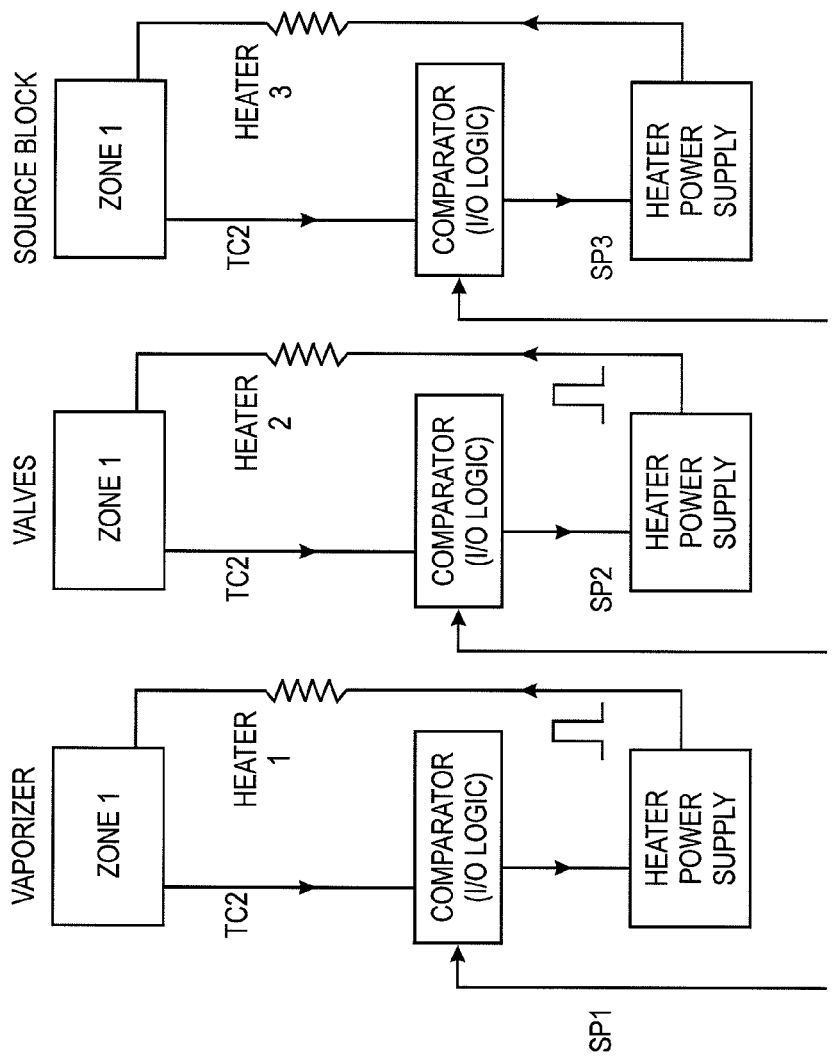
FIG. 6 is a diagram of the 3-zone temperature control system used in the ion source of the present invention.

FIG. 6 illustrates a closed-loop control system for three independent temperature zones, showing a block diagram of a preferred embodiment in which three temperature zones are defined: zone 1 for vaporizer body 30, zone 2 for isolation valves 100 and 110, and zone 3 for the source block 35. Each zone may have a dedicated controller; for example, an Omron E5CK Digital Controller. In the simplest case, heating elements alone are used to actively control temperature above room ambient, for example, between 18 C to 200 C or higher. Thus, resistive cartridge-type heaters can be embedded into the vaporizer body 30 (heater 1) and the source block 35 (heater 3), while the valves 100, 110 can be wrapped with silicone strip heaters (heater 2) in which the resistive elements are wire or foil strips. Three thermocouples labeled TC1, TC2, and TC3 in FIG. 6 can be embedded into each of the three components 30, 35, 100 (110) and continuously read by each of the three dedicated temperature controllers. The temperature controllers 1, 2, and 3 are user-programmed with a temperature setpoint SP1, SP2, and SP3, respectively. In one embodiment, the temperature setpoints are such that SP3>SP2>SP1. For example, in the case where the vaporizer temperature is desired to be at 30 C, SP2 might be 50C and SP3 70 C. The controllers typically operate such that when the TC readback does not match the setpoint, the controller's comparator initiates cooling or heating as required. For example, in the case where only heating is used to vary temperature, the comparator output is zero unless TC1<SP1. The controllers may contain a look-up table of output power as a nonlinear function of temperature difference SP1−TC1, and feed the appropriate signals to the controller's heater power supply in order to smoothly regulate temperature to the programmed setpoint value. A typical method of varying heater power is by pulse-width modulation of the power supply. This technique can be used to regulate power between 1% and 100% of full scale. Such PID controllers can typically hold temperature setpoint to within 0.2 C.

Magnetic Yoke Assembly

Figure 7A:
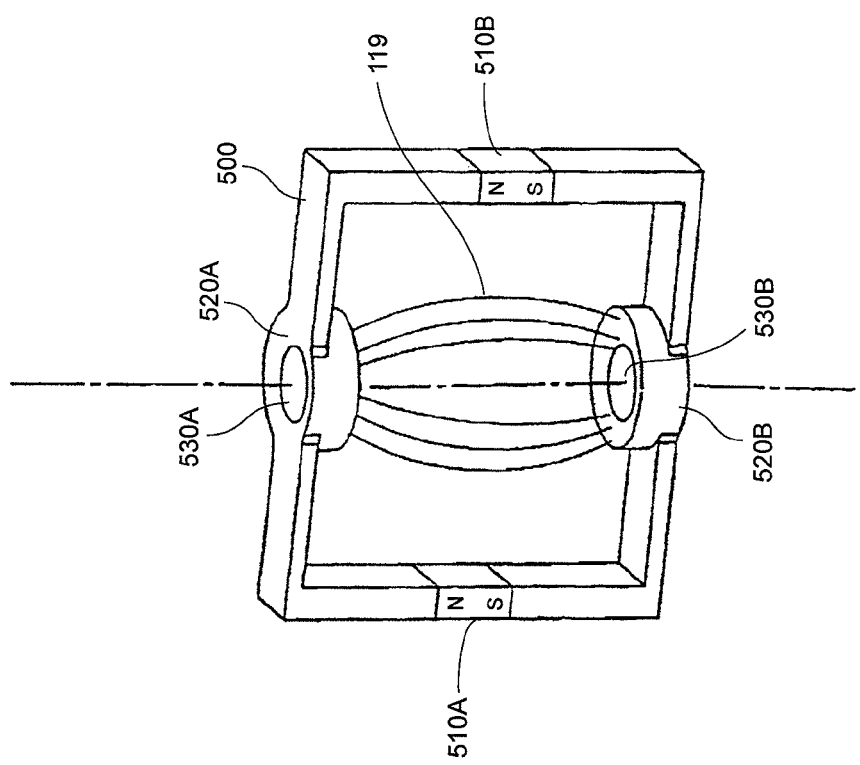
FIG. 7A is a perspective view of the magnetic yoke assembly, illustrating the magnetic circuit which includes permanent magnets.
Figure 7B:
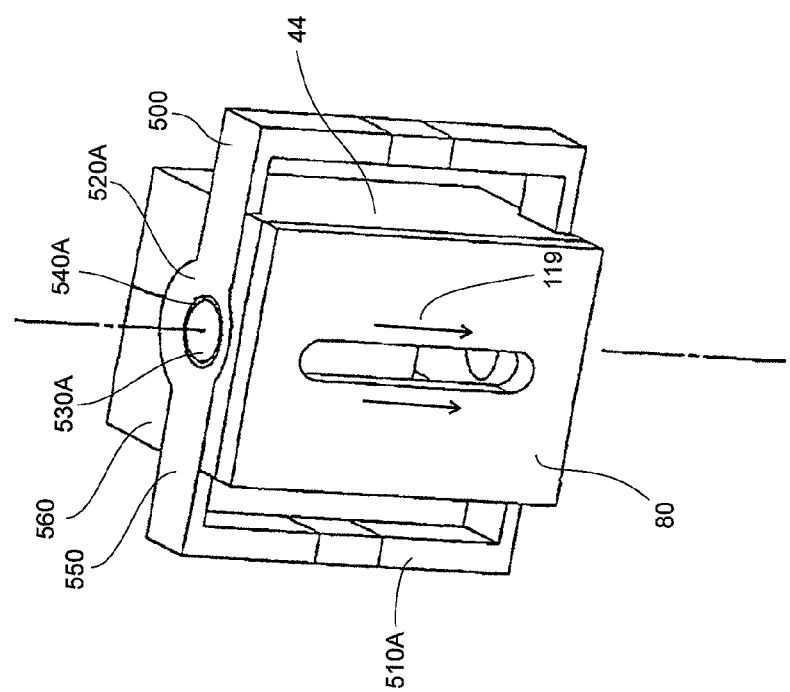
FIG. 7B is a perspective view of the magnetic yoke assembly integrated into the ionization chamber of the ion source of the present invention.
Figure 7C:
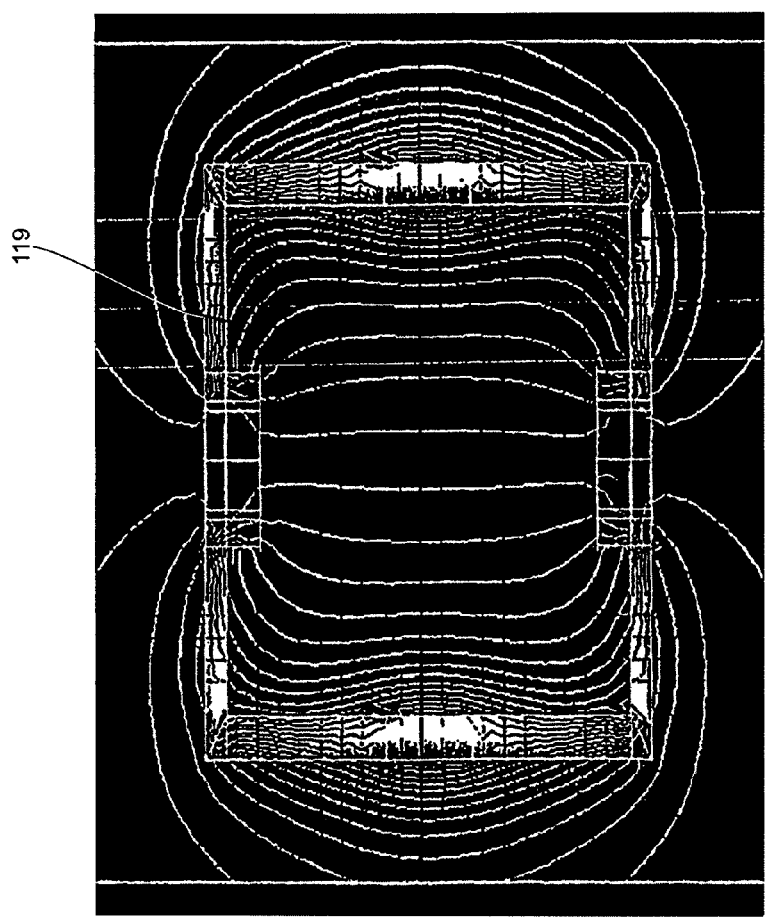
FIG. 7C is an illustration of the magnetic flux through a cross-section of the magnetic yoke assembly in the xy plane.

In one embodiment, a uniform magnetic field B' 119 is established within ionization chamber 44 by the incorporation of a permanent magnetic yoke assembly 500, shown in FIG. 7A, into ionization chamber 44. Referring now to FIG. 7A, magnetic flux is generated by a pair of permanent magnets, for example, samarium-cobalt magnets 510a and 510b, and returned through yoke assembly 500 through the gap between the C-shaped symmetrical pole pieces 520a and 520b. The electron beam 70 enters through the hole 530a in the yoke 520a and exits through the hole 530b in the yoke 520b. FIG. 7C shows how yoke assembly 500 integrates into ionization chamber 44. In FIG. 7B, the ionization chamber 44 has a milled-out section which receives the yoke assembly 500 and the poles 520a and 520b such that the surface 550 of the yoke assembly 500 and the surface of the ionization chamber 44 are flush. The interior wall of the narrow annulus 540a and 540b (not shown), machined as part of ionization chamber 44, defines an electron entrance aperture 70a and an electron exit aperture 71, insuring that the ferromagnetic material of the yoke assembly 500 is not exposed to the electron beam, reducing any possibility of ferrous metals contamination within the ionization volume of ionization chamber 44. FIG. 7C shows lines of flux along a cross-section containing the xy plane (x is horizontal, y is vertical, antiparallel to the direction of propagation of electron beam 70 as shown in FIG. 5) of yoke assembly 500, calculated with field modeling software. Very uniform field lines 119 are generated within the propagation volume of electron beam 70. B' 119 is directed parallel to incoming electron beam 70 in order to confine electron beam 70.

Figure 7D:
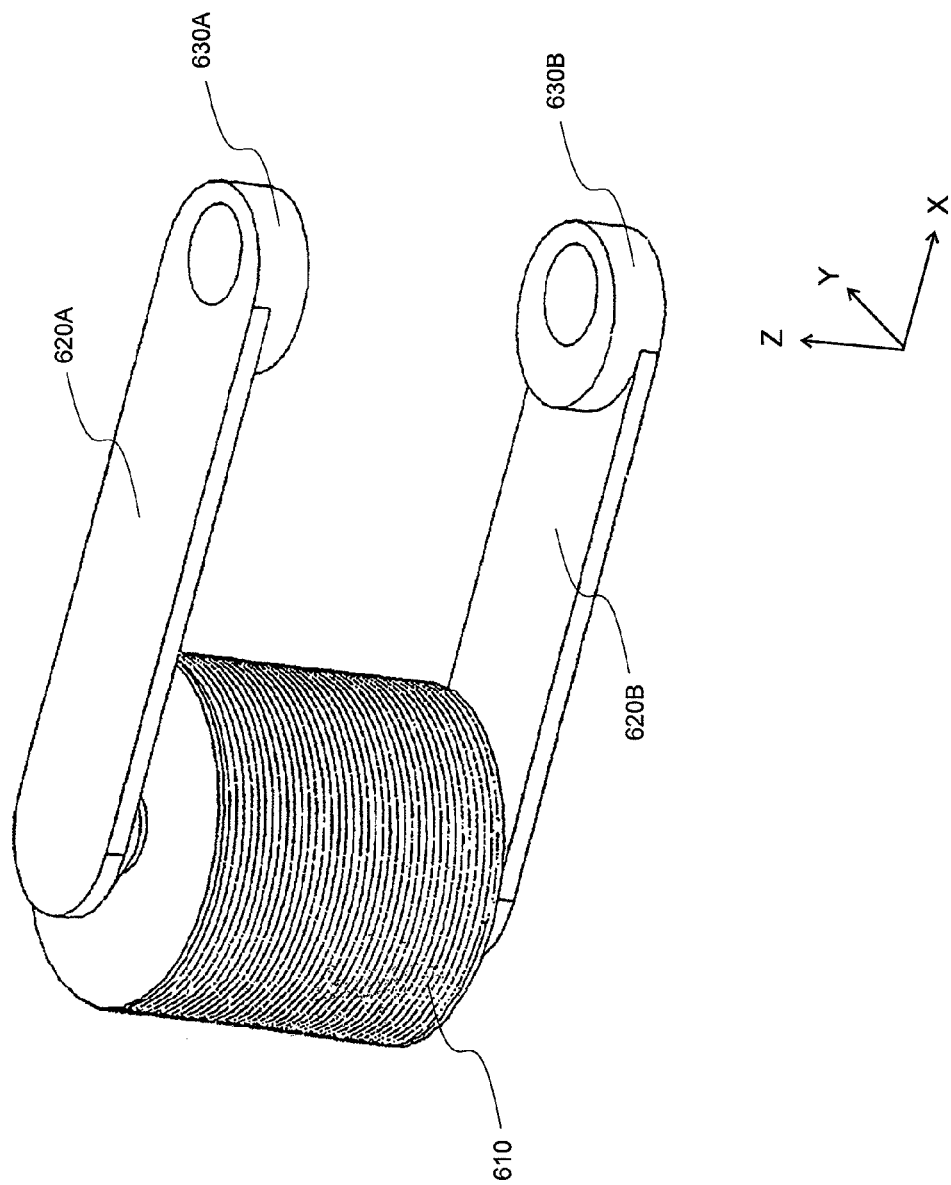
FIG. 7D is a perspective view of an alternative embodiment of the magnetic yoke assembly illustrated in FIG. 7A, which includes an electromagnet.

A different embodiment of a magnetic yoke assembly is shown in FIG. 7D. This embodiment consists of a magnetic coil 610, an upper yoke 620a and an upper pole 630a, and an lower yoke 630a and a lower pole 630b; a bobbin core 600 connects the upper yoke 620a and the lower yoke 630b in a magnetic circuit which returns flux through the vacuum gap between the upper pole 630a and the lower pole 630b. Flux is generated by an electrical current through the coil 610 wire. The flux is carried by bobbin core 600 to the upper and lower yokes 630a and 630b. By varying the coil current, the magnetic flux density (i.e., the strength of the magnetic field) can in turn be varied in the vacuum gap.

Figure 7E:
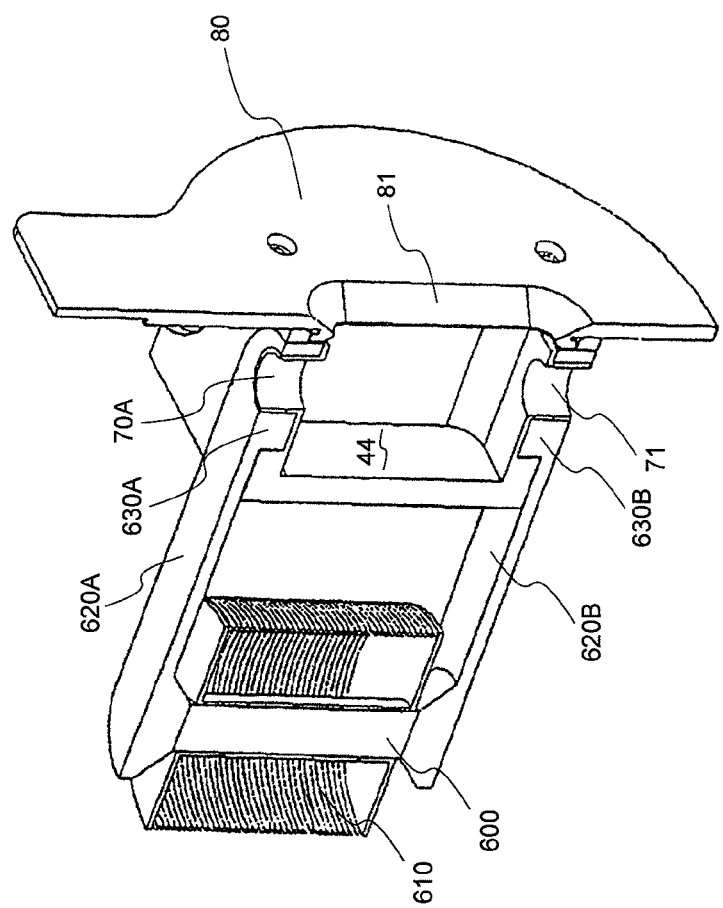
FIG. 7E is similar to FIG. 7B except that it relates to the embodiment illustrated in FIG. 7D.

FIG. 7E shows a cutaway view (containing the Y-Z plane) of the magnetic yoke assembly of FIG. 7D integrated into the ion source of the present invention. The geometry of the yoke assembly as depicted in FIG. 7E differs markedly from the yoke assembly depicted in FIG. 7B. A significant departure from FIG. 7B lies in the geometry of the yokes 620a and 620b, which are oriented along the Y-direction (antiparallel to the direction of propagation of the ion beam). The yoke assembly of FIG. 7E also utilizes a simpler magnetic circuit, having only one pair of return yokes 620a and 630b, instead of the two pairs of return yokes in magnetic yoke assembly 500 depicted in FIG. 7A. The coil 610 is embedded in the source block 35 to provide heat sinking of the coil to the temperature-controlled source block 35 (not shown in FIG. 7E).

Figure 7F:
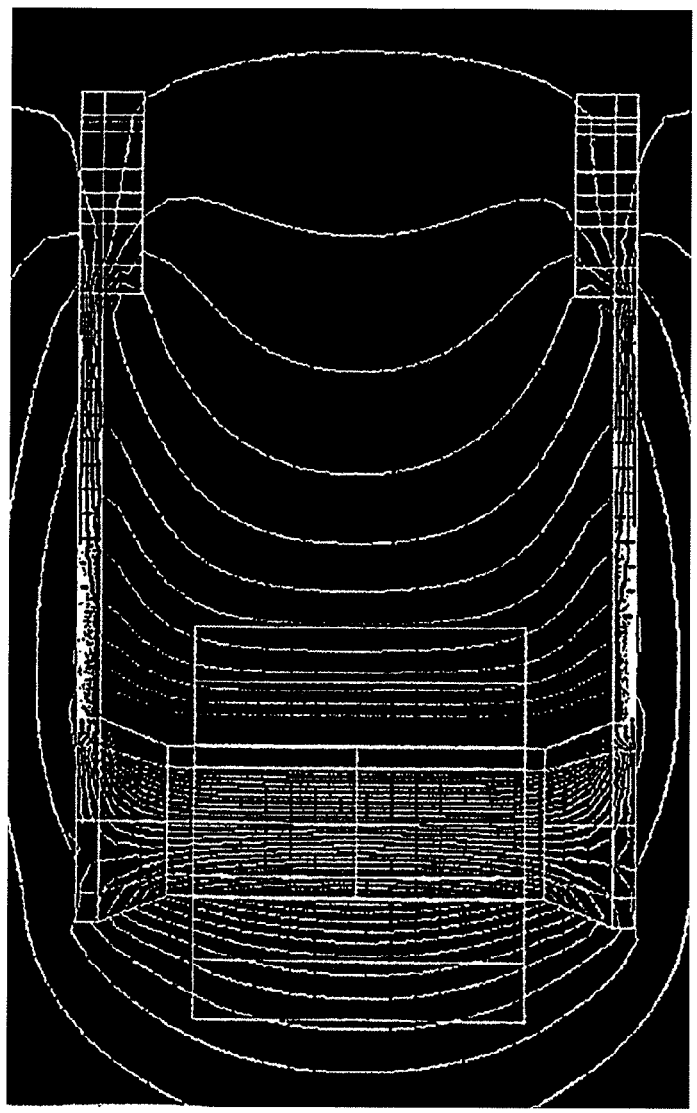
FIG. 7F is an illustration of the magnetic flux through a cross-section of the magnetic yoke assembly depicted in FIG. 7E, in the yz plane.
Figure 7G:
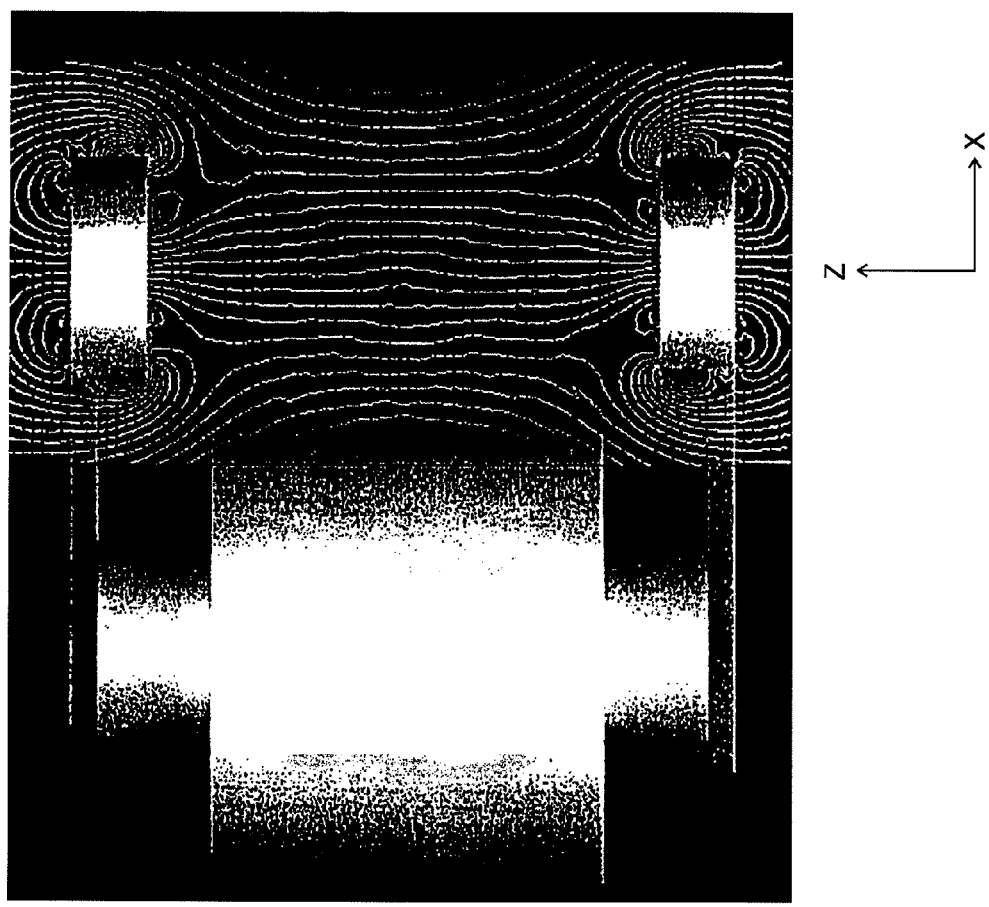
FIG. 7G is similar to FIG. 7F except that it illustrates magnetic flux in the xz plane.

FIG. 7F depicts the flux paths and flux density through the magnetic yoke assembly of FIG. 7D, the leakage flux is largely restricted to the anterior of the ion source, out of the ion beam path, while a relatively uniform flux density is produced between the poles 630a and 630b, wherein resides the ionization volume containing electron beam 70. With a coil current of 3000 amp-turns, a magnetic flux density of about 100 Gauss can be produced along the Z-direction (a line joining the center of upper pole 630a and lower pole 630b). A user-selectable flux density is thus produced along Z from zero to 100 Gauss by controlling the electrical current through the coil 610. Referring now to FIG. 7G, flux lines in the X-Z plane, within the ionization region and parallel to the plane containing ion extraction plate 80' and ion extraction aperture 81', are shown. The Z-component of flux is quite uniform in this region directly the ion extraction aperture 81'. The ion extraction 81' aperture would be oriented along Z, in the plane of the paper.

Figure 7H:
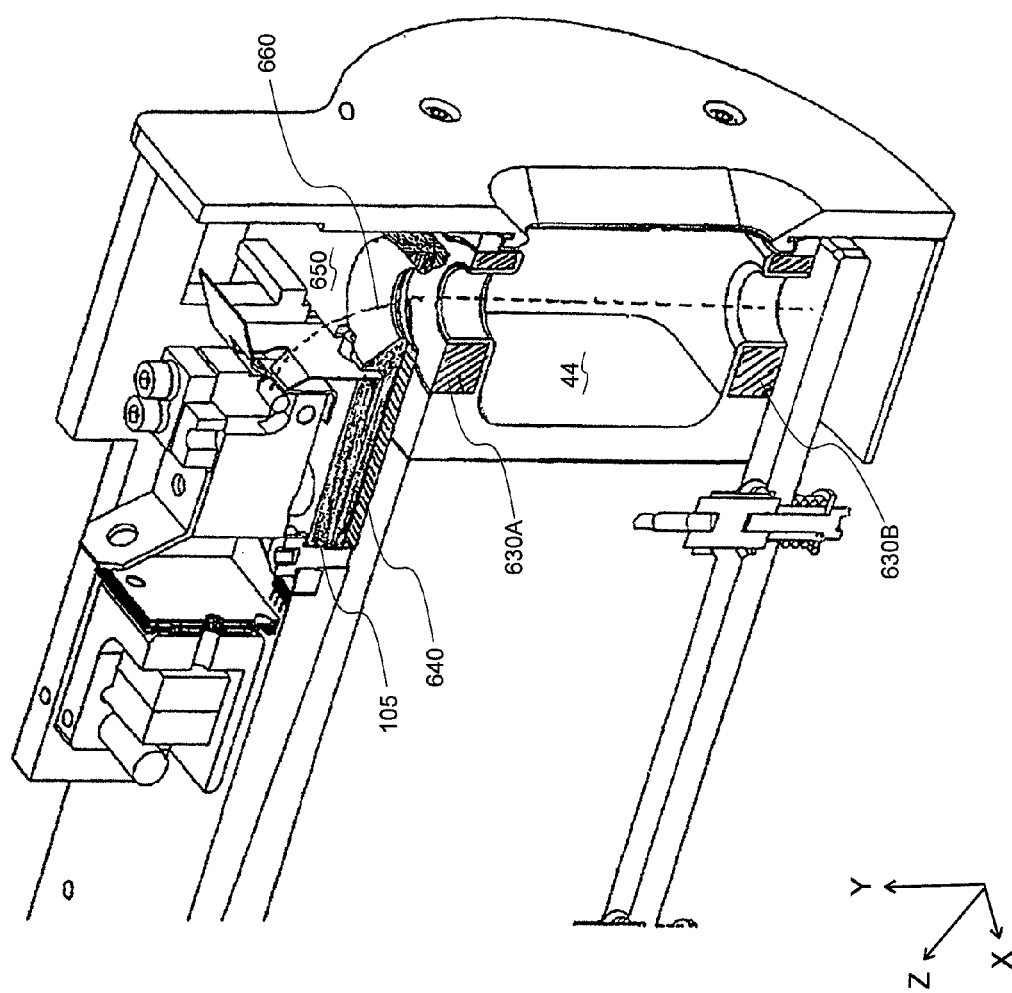
FIG. 7H depicts the ion source of the present invention with a high-permeability magnetic shield between the yoke assembly of FIG. 7B and the electron gun.

FIG. 7H depicts the incorporation of a high-permeability magnetic shield 640 under the baseplate 105 of the electron gun, in order to prevent the field produced by pole 630a from penetrating into region 650 wherein the electron beam is guided through 90 degrees. Without shield 640, stray magnetic fields along the vertical or y-direction would cause unwanted deflection of the electron beam in the lateral or x-direction, causing an error in the trajectory 660 of the electron beam prior to entering ionization chamber 44.

By incorporating the magnetic yoke assembly of FIG. 7B as shown in FIG. 7H in the ion source of FIG. 4A, for example, it is realized that the resulting use of a confining magnetic field helps to counteract dispersive space-charge forces which would blow up electron beam 70 subsequent to deceleration, i.e., as it enters ionization chamber 44. This has the benefit of enabling higher charge density in electron beam 70, hence higher ion density near to the preferred ionization region adjacent to ion extraction aperture 81, resulting in increased ion current 120. Further gains may be realized by biasing beam dump 72 to a negative voltage Vr, relative to ionization chamber 44, by power supply 117. For example, if Vr≤Vc, then a reflex mode may be established, whereby primary electrons contained in electron beam 70 are reflected from beam dump 72, increasing the effective path length of the electrons. At sufficiently low electron energies, the presence of confining field B' 119 causes the reflected electrons to execute a helical trajectory along the direction of B'. We note that B 135 and B' 119 are orthogonal in direction, 8 135 deflecting the electron beam 70 into ionization chamber 44 and B' 119 confining the resultant beam; therefore magnetic shield 118 is added to the bottom of base plate 105. Magnetic shield 118 is made of high-permeability metal so as to prevent the two fields from mixing; this separates the path of electron beam 70 into two regions of magnetic field; outside ionization chamber 44, and within ionization chamber 44.

Method For Generating Boron Hydride Cluster Ions

Figure 8A:
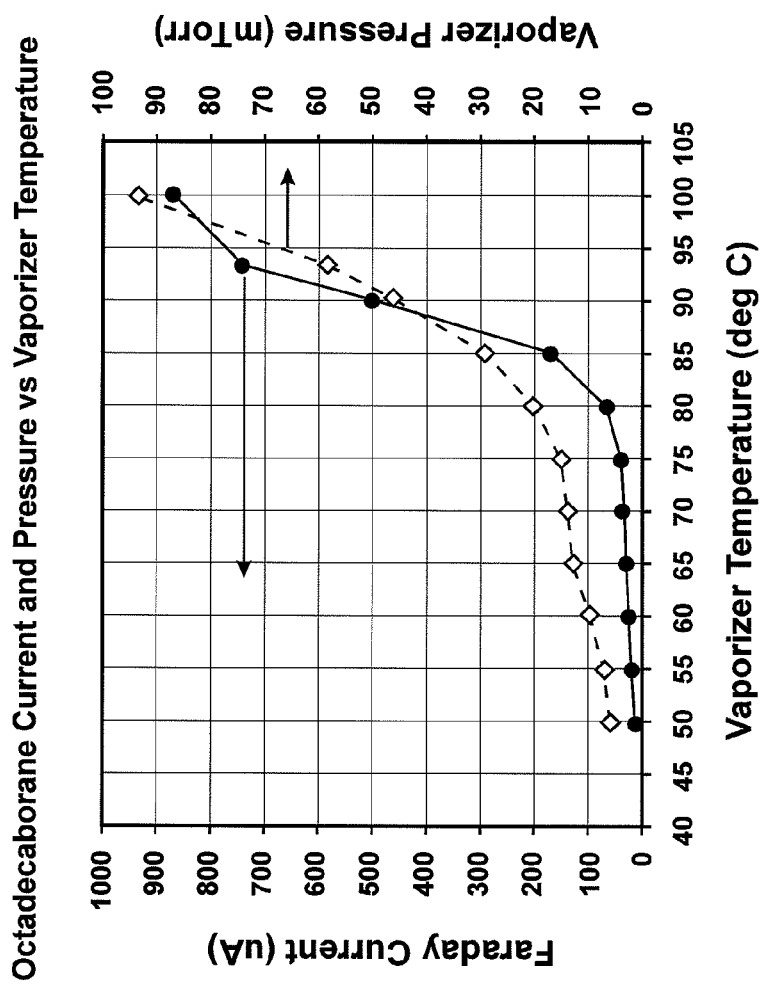
FIG. 8A is a graphical illustration of octadecaborane beam current and vapor pressure, versus vaporizer temperature, using the ion source of the present invention.

The method herein described can be considered normal operation of the ion source of the present invention where the only difference from other operational modes is the user's choice of values for the source parameters (feed material, feed gas flow rate, electron ionization energy and current, and source component temperature(s)). Solid octadecaborane, $B_{18}H_{22}$ may be used, to produce boron hydride cluster ions of the form $B_{18}H_x^+$, by using the vaporizer and ion source depicted in FIG. 3. Octadecaborane is a stable solid at room temperature and has a vapor pressure of a few millitorr. In order to generate useful mass flows of about 1 sccm of octadecaborane vapor 32, the vaporizer 28 may be held at about 90 C. FIG. 8A displays a plot of two variables as a function of vaporizer temperature: vaporizer pressure on the right vertical axis, and ion current delivered to the post-analysis Faraday cup of a high-current implanter similar to that depicted in FIG. 1d. Referring back to FIG. 3, the vaporizer pressure was measured by a capacitance manometer 60 in communication with a valve 110. Typical source operating parameters were: valve (100 and 110) temperature=120 C, source block 35 temperature=120 C, electron ionization energy=1 keV, electron beam current≈70 mA. This was achieved by setting Vc=−1 kV, Va=1.3 kV, Vr=−1 kV, and filament emission current=160 mA.

Figure 8B:
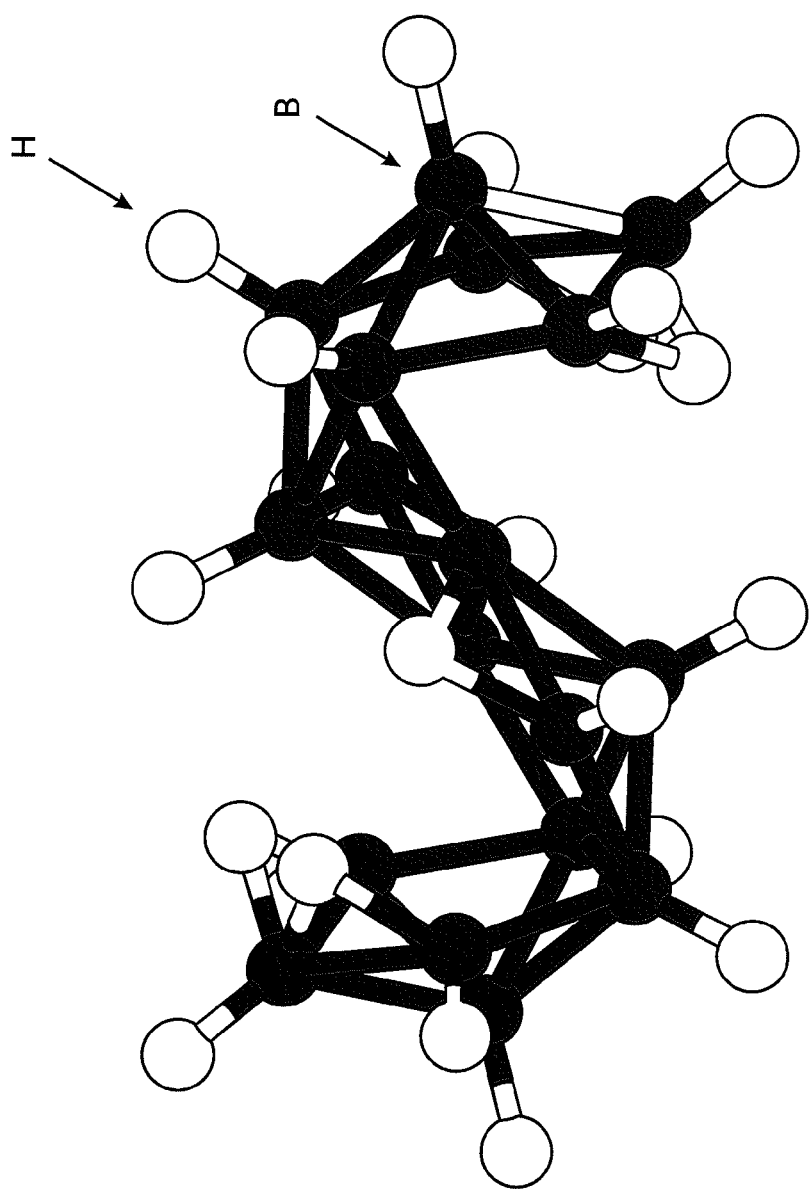
FIG. 8B is a ball-and-stick model of the $B_{18}H_{22}$ molecule.

FIG. 8b illustrates the molecular structure of $B_{18}H_{22}$, and shows the relative positions of H atoms (light spheres) and B atoms (dark spheres).

Figure 9:
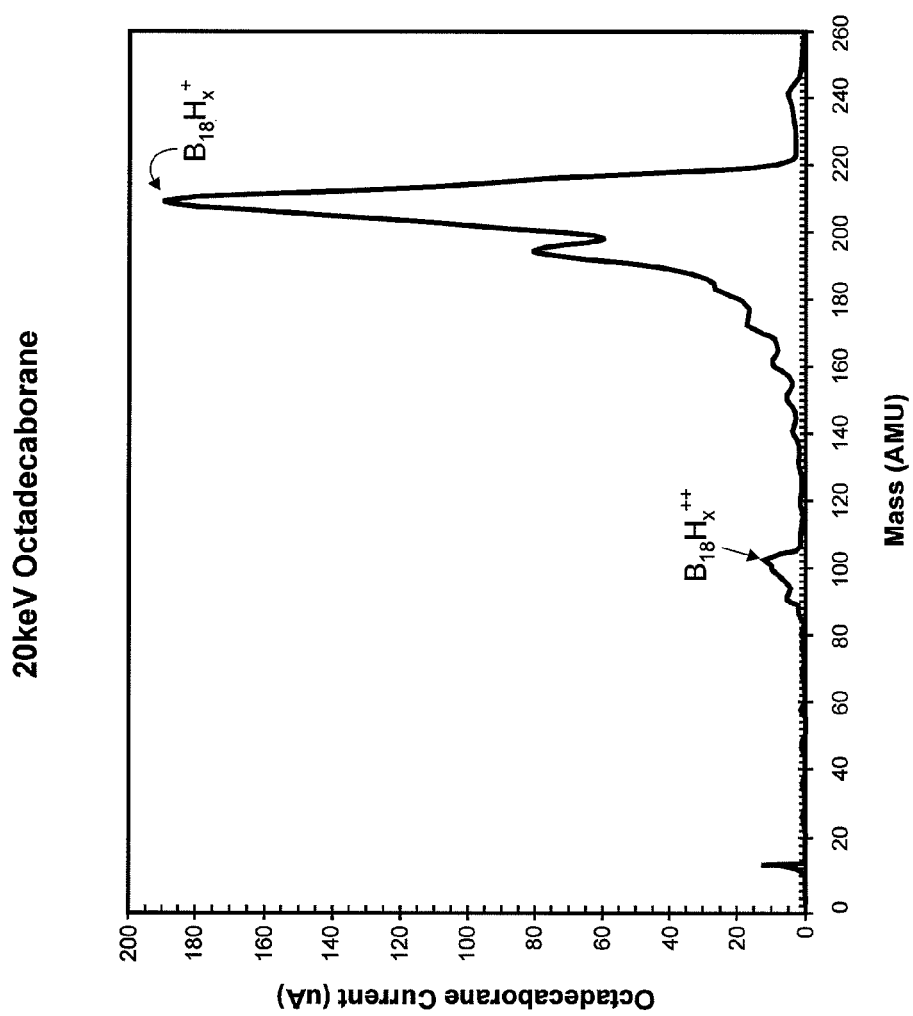
FIG. 9 is a graphical illustration of the positive ion mass spectrum of $B_{18}H_{22}$ generated with the ion source of the present invention, collected at high mass resolution.
Figure 10:
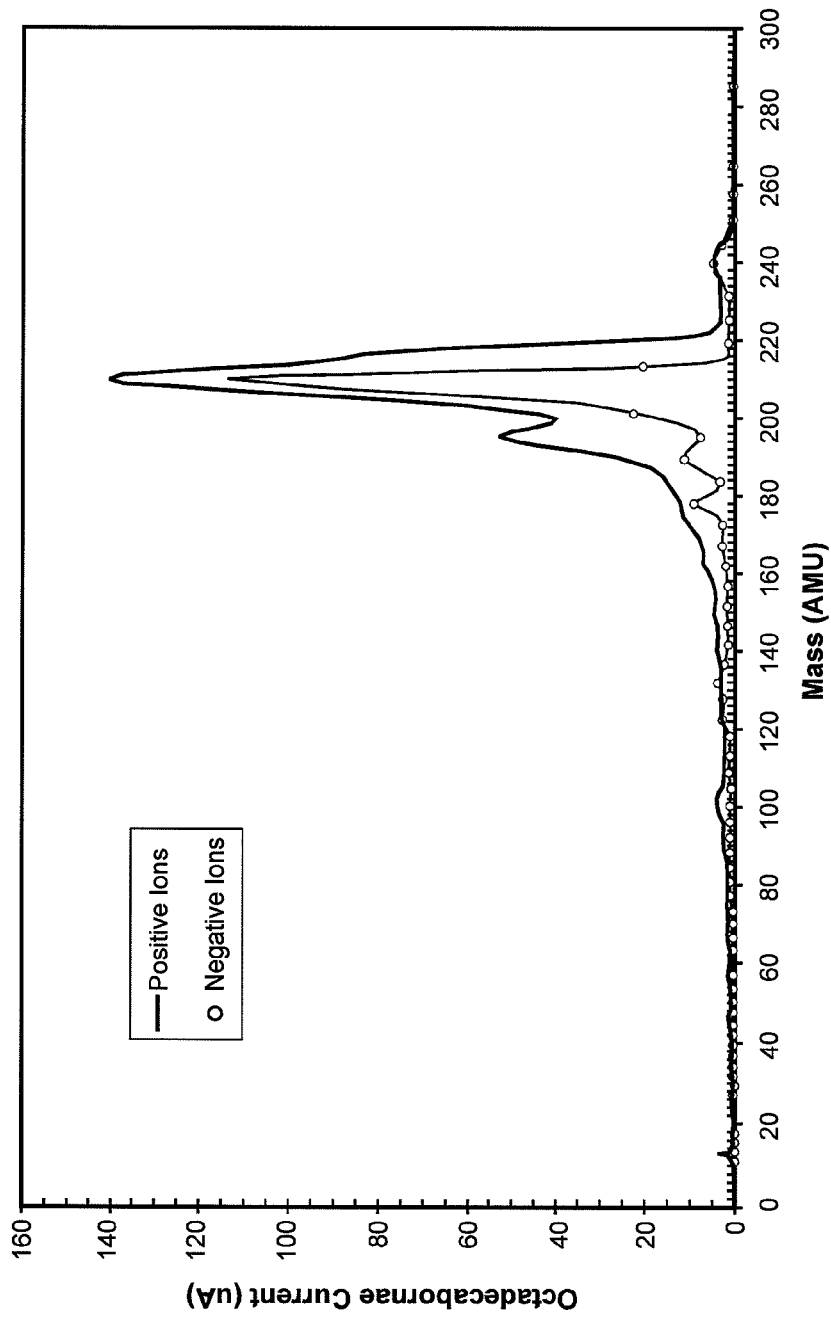
FIG. 10 is a graphical illustration of the negative ion mass spectrum of $B_{18}H_{22}$ overlaid with a positive ion mass spectrum of $B_{18}H_{22}$, both collected at high mass resolution, and generated with the ion source of the present invention.
Figure 11B:
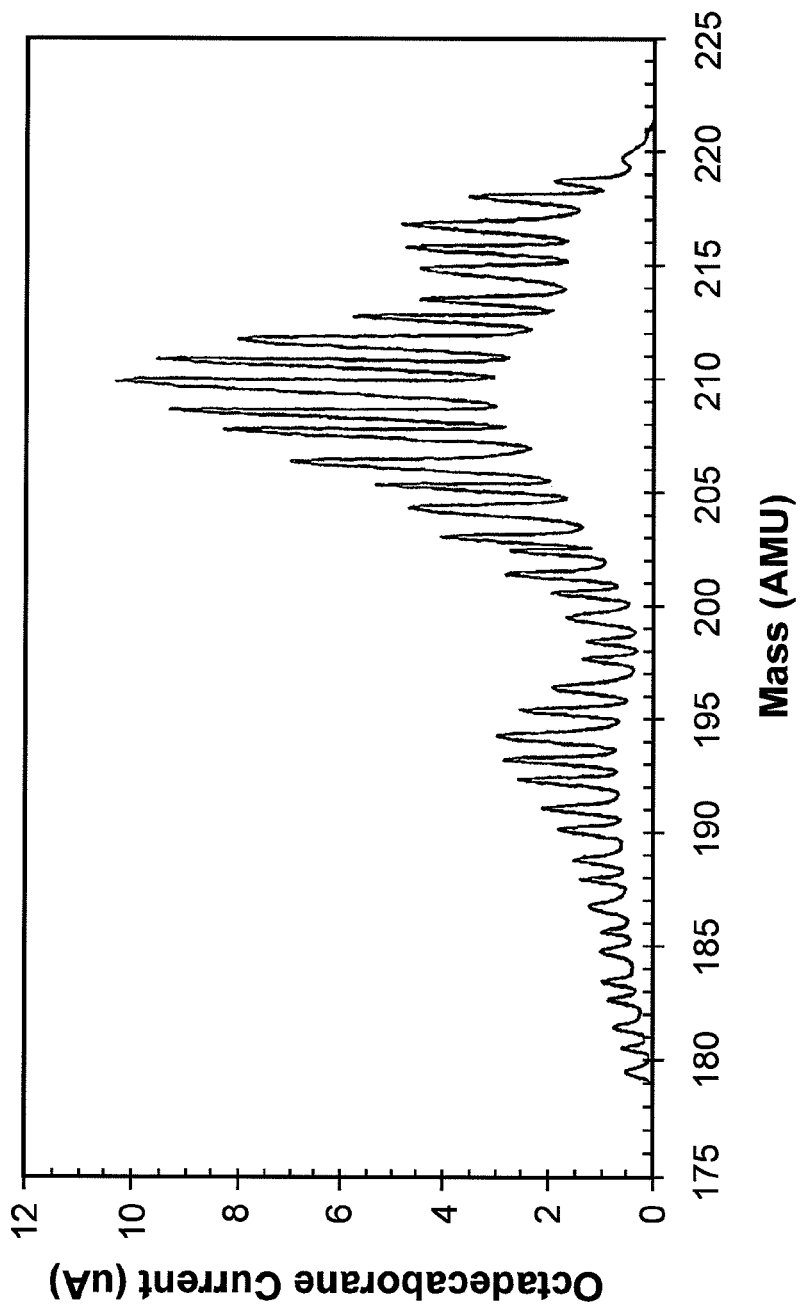
FIG. 11B is a graphical illustration of the positive mass spectrum of $B_{18}H_{22}$ generated with the ion source of the present invention, collected at highest mass resolution and with an expanded horizontal scale, so that individual ion masses can be resolved.
Figure 12:
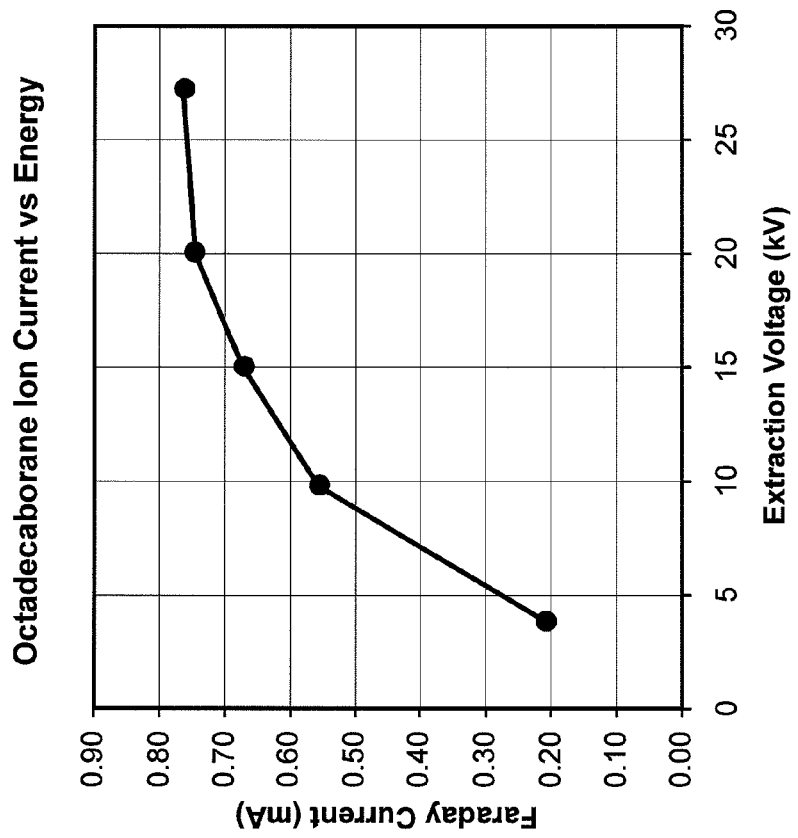
FIG. 12 is a graphical illustration of $B_{18}H_x^+$ beam current as a function of beam extraction energy, measured near the wafer position by a cluster ion implantation system of the present invention.
Figure 13:
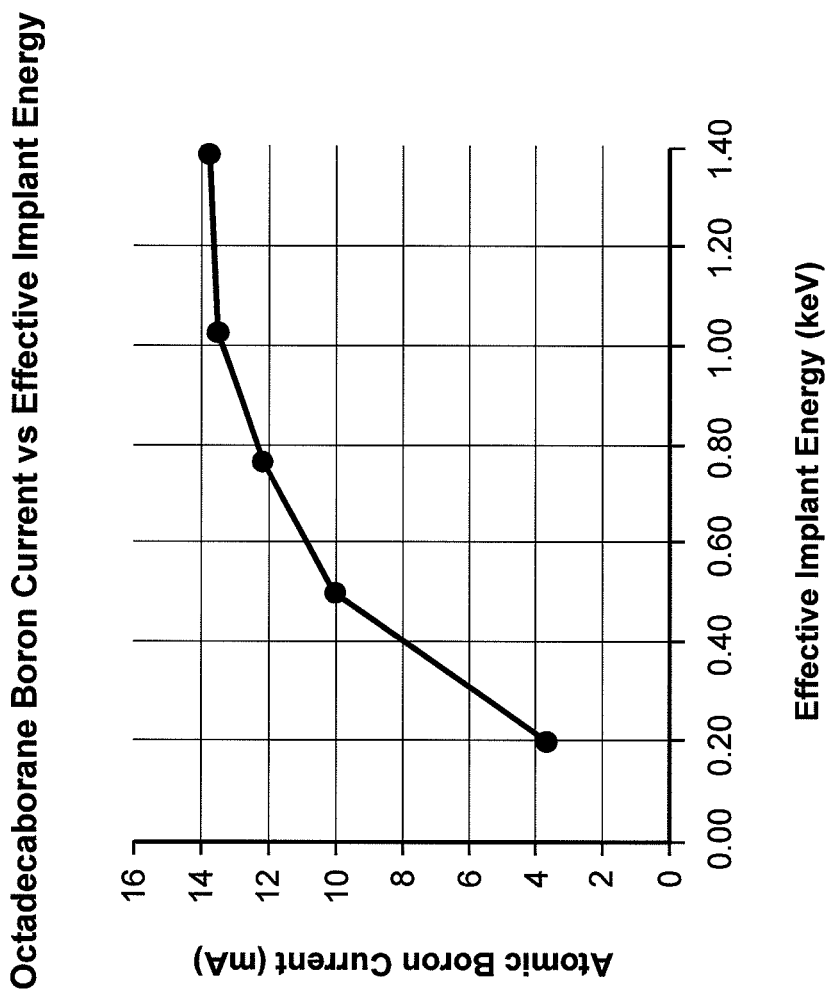
FIG. 13 is a graphical illustration of the data of FIG. 12 converted to boron dose rate (using $B_{18}H_x^+$ implantation) as a function of boron implant energy, using a cluster ion implantation system of the present invention.

FIG. 9 shows an octadecaborane mass spectrum collected under similar conditions to those used to generate FIG. 8A, in a cluster ion implantation system similar to that disclosed in FIG. 1D. The variable resolving aperture 270 was set to a high mass resolution, which selected a four-AMU wide ion beam 240 to a downstream Faraday cup. FIG. 10 shows an octadecaborane mass spectrum for both negative and positive ions, collected under conditions similar to those used to generate the data of FIG. 9. The polarity of all the implanter power supplies were reversed to switch between negative and positive ions, which were collected within a few minutes of one another and recorded on the same plot. The $B_{18}H_x^+$ and $B_{18}H_x^-$ peaks are at 210 AMU, suggesting a most probable chemical formula for the ions of $B_{18}H_{16}^+$ and $B_{18}H_{16}^-$, respectively. FIG. 11A was collected under conditions similar to those used to collect the data of FIG. 9, but with the resolving aperture 270 set to allow about 18 AMU to pass downstream, allowing much higher $B_{18}H_x^+$ currents. However, the lack of structure in the main peak attests to reduced mass resolution. FIG. 11B is a detail collected at highest mass resolution. With the resolving aperture set at <1 mm, only a single AMU was passed downstream to the Faraday. Thus, individual boron hydride peaks separated by one AMU are clearly visible. FIG. 12 shows a plot of beam current at the Faraday versus extraction voltage without any deceleration of the ion beam, collected at the low mass resolution of FIG. 11A. FIG. 13 shows the data of FIG. 12 converted to atomic boron current versus effective implant energy, as a means of comparison with monomer boron implantation. Atomic boron current=18× octadecaborane Faraday current, and effective implant energy=11/210× extraction voltage. These currents are many times greater than currently attainable with conventional monomer boron implantation, particularly without ion deceleration.

Figure 20:
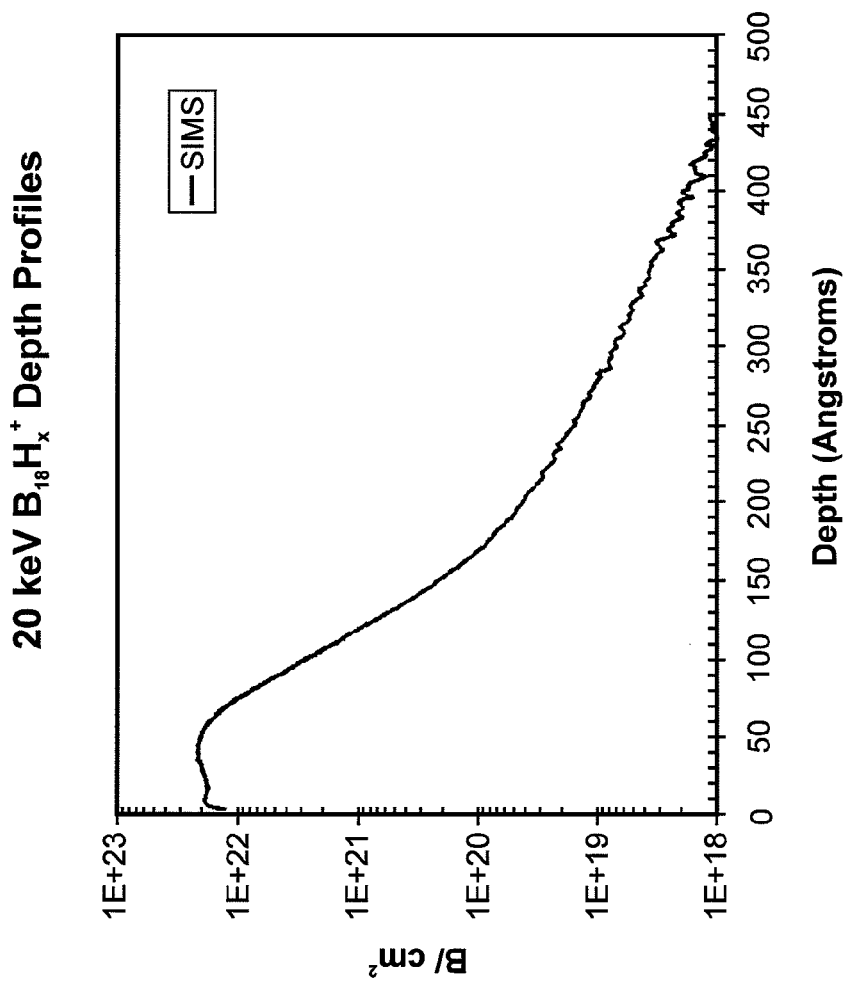
FIG. 20 is a graphical illustration of as-implanted SIMS profiles of boron concentrations from a 20 keV $B_{18}H_x^+$ ion beam implanted into a silicon wafer by a cluster ion implantation system of the present invention.

In order to characterize the implantation profile of $B_{18}H_x^+$ for boron doping of semiconductors, a commercial silicon wafer was dipped in HF solution to remove any native oxide, and implanted in a cluster ion implantation system similar to that disclosed in FIG. 1D. A boron dose of $2\times10^{16}$ cm$^{-2}$ was delivered by implanting a $B_{18}H_x^+$ dose of $1.1\times10^{15}$ cm$^2$. The $B_{18}H_x^+$ ion energy was 20 keV during the implant, resulting in an effective boron implant energy of about 1 keV per boron atom. FIG. 20 shows the as-implanted boron profile as determined by SIMS (Secondary Ion Mass Spectrometry). The peak of the profile is at about 50 Å, which agrees well with a projected range of 58 Å predicted by TRIM calculations for a 1 keV boron implant.

Formation of N- and P-Type Shallow Junctions

An important application of this method is the use of cluster ion implantation for the formation of N- and P-type shallow junctions as part of a CMOS fabrication sequence. CMOS is the dominant digital integrated circuit technology in current use and its name denotes the formation of both N-channel and P-channel MOS transistors (Complementary MOS: both N and P) on the same chip. The success of CMOS is that circuit designers can make use of the complementary nature of the opposite transistors to create a better circuit, specifically one that draws less active power than alternative technologies. It is noted that the N and P terminology is based on Negative and Positive (N-type semiconductor has negative majority carriers, and vice versa), and the N-channel and P-channel transistors are duplicates of each other with the type (polarity) of each region reversed. The fabrication of both types of transistors on the same substrate requires sequentially implanting an N-type impurity and then a P-type impurity, while protecting the other type of devices with a shielding layer of photoresist. It is noted that each transistor type requires regions of both polarities to operate correctly, but the implants which form the shallow junctions are of the same type as the transistor: N-type shallow implants into N-channel transistors and P-type shallow implants into P-channel transistors. An example of this process is shown in FIGS. 14 and 15. In particular, FIG. 14 illustrates a method for forming the N-channel drain extension 89 through an N-type cluster implant 88, while FIG. 15 shows the formation of the P-channel drain extension 90 by a P-type cluster implant 91. It is to be noted that both N- and P-types of transistors requires shallow junctions of similar geometries, and thus having both N-type and P-type cluster implants is advantageous for the formation of advanced CMOS structures.

Figure 16:
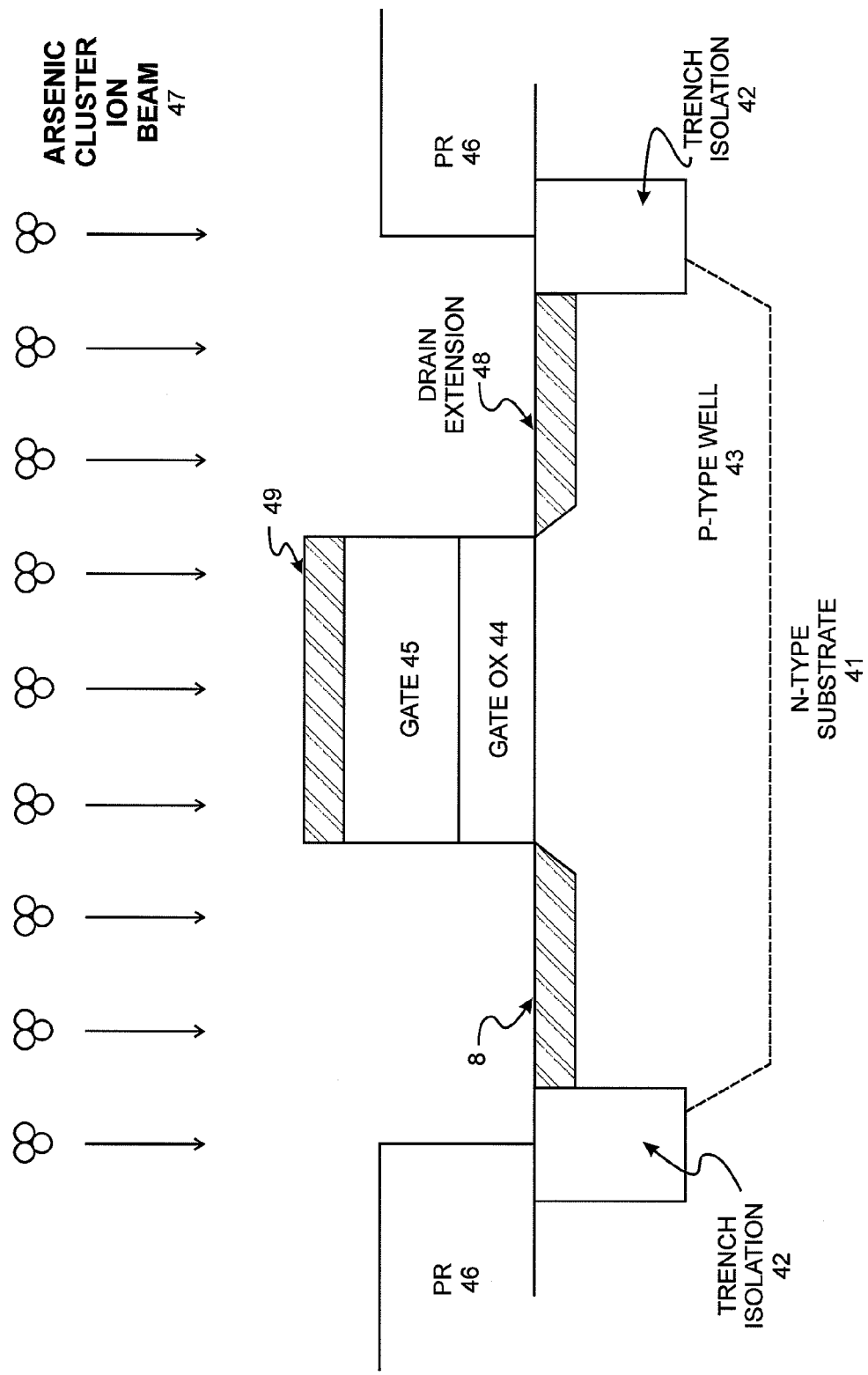
FIG. 16 is a diagram of a semiconductor substrate in the process of manufacturing a NMOS semiconductor device, at the step of N-type drain extension implant.

An example of the application of this method is shown in FIG. 16 for the case of forming an NMOS transistor. This figure shows semiconductor substrate 41 which has undergone some of the front-end process steps of manufacturing a semiconductor device. For example, the structure consists of a N-type semiconductor substrate 41 processed through the P-well 43, trench isolation 42, and gate stack formation 44, 45 steps. An exemplary process for forming the gate stack, P-well and trench isolation is disclosed in co-pending patent application PCT/US03/19085, filed on Jun. 18, 2003, entitled "A semiconductor Device and Method of Fabricating a Semiconductor Device".

The P-well 43 forms a junction with the N-type substrate 41 that provides junction isolation for the transistors in the well 43. The trench isolation 42 provides lateral dielectric isolation between the N- and P-wells (i.e., in the overall CMOS structure). The gate stack is constructed, with a gate oxide layer 44 and a polysilicon gate electrode 45, patterned to form a transistor gate stack. A photoresist 46 is applied and patterned such that the area for NMOS transistors is exposed, but other areas of the substrate 41 are shielded. After the photoresist 46 is applied, the substrate 41 is ready for the drain extension implant, which is the shallowest doping layer required by the device fabrication process. A typical process requirement for leading-edge devices of the 0.13 μm technology node is an arsenic implant energy of between 1 keV and 2 keV, and an arsenic dose of $5\times10^{14}$ cm$^2$. The cluster ion beam 47, As$_4$H$_x^+$ in this case, is directed at the semiconductor substrate, typically such that the direction of propagation of the ion beam is normal to the substrate, to avoid shadowing by the gate stack. The energy of the As$_4$H$_x^+$ cluster should be four times the desired As$^+$ implant energy, e.g., between 4 keV and 8 keV. The clusters dissociate upon impact with the substrate, and the dopant atoms come to rest in a shallow layer near the surface of the semiconductor substrate, which forms the drain extension region 48. We note that the same implant enters the surface layer of the gate electrode 49, providing additional doping for the gate electrode. The process described in FIG. 16 is thus one important application of the proposed invention.

Figure 17:
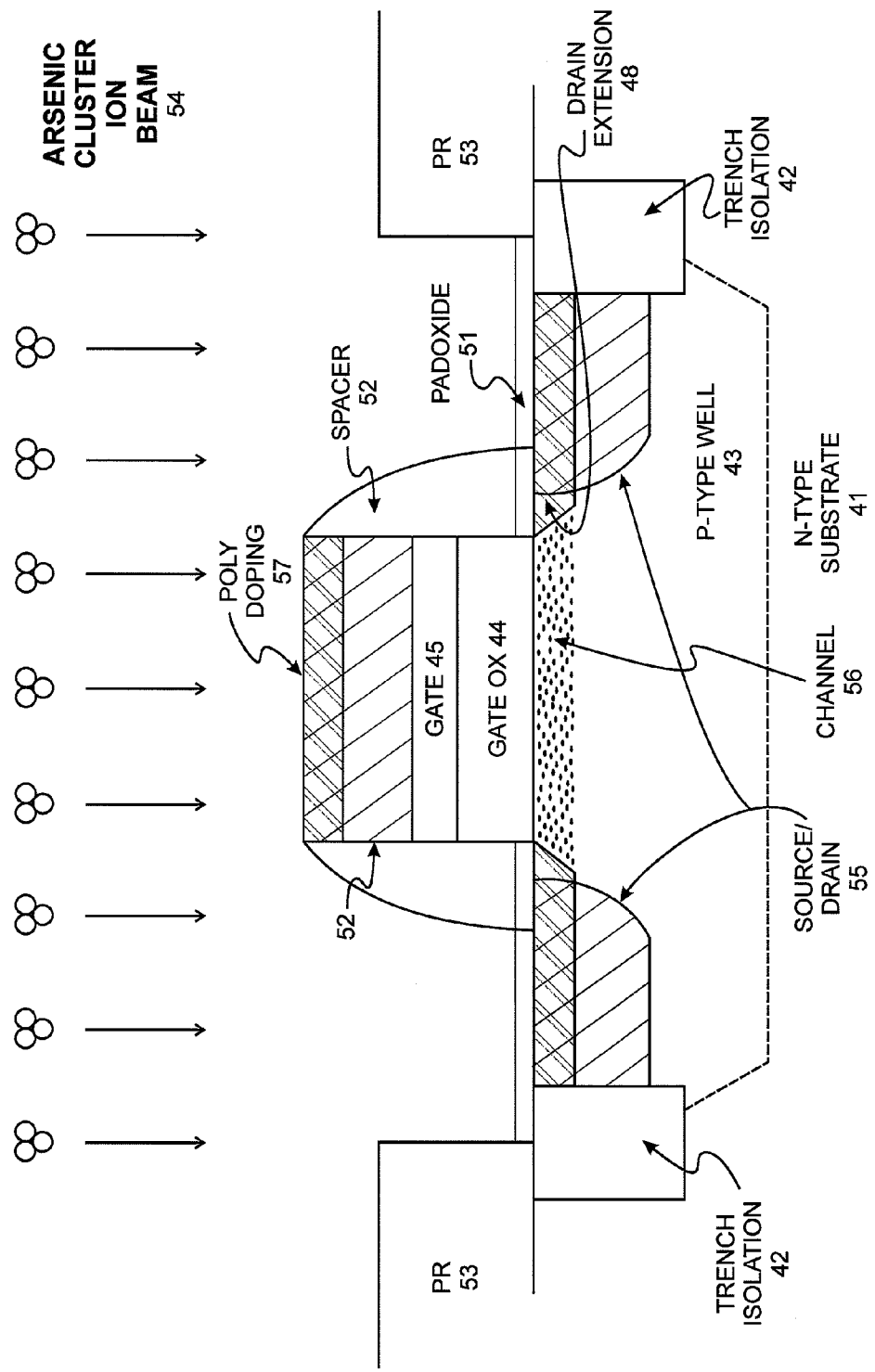
FIG. 17 is a diagram of a semiconductor substrate in the process of manufacturing a NMOS semiconductor device, at the step of the source/drain implant.

A further example of the application of this method is shown in FIG. 17: the formation of the deep source/drain regions. This figure shows the semiconductor substrate 41 of FIG. 16 after execution of further processes steps in the fabrication of a semiconductor device. The additional process steps include the formation of a pad oxide 51 and the formation of spacers 52 on the sidewalls of the gate stack. The pad oxide 51 is a thin layer of oxide (silicon dioxide) used to protect the exposed substrate areas, the top of the gate electrode 49 and the potentially exposed gate dielectric edge. The pad oxide 51 is typically thermally grown to a thickness of 5-10 nm. The spacer 52, on the other hand, is a region of dielectric, either silicon dioxide, silicon nitride, or a combination of these, which resides on the side of the gate stack and serves to insulate the gate electrode. It also serves as an alignment guide for the source/drain implant (e.g., 54), which must be spaced back from the gate edge for the transistor to operate properly. The spacers 52 are formed by the deposition of silicon dioxide and/or silicon nitride layers which are then plasma etched in a way to leave a residual layer on the side of the gate stack while clearing the dielectrics from the source/drain region.

After etching the spacers 52, a photoresist layer 53 is applied and patterned to expose the transistor to be implanted, an NMOS transistor in this example. Next, the ion implant to form the source and drain regions 55 is performed. Since this implant requires a high dose at low energy, it is an appropriate application of the proposed cluster implantation method. Typical implant parameters for the 0.13 μm technology node are approximately 6 keV per arsenic atom (54) at an arsenic dose of $5\times10^{15}$ cm$^{-2}$, so it requires a 24 keV, $1.25\times10^{15}$ cm$^{-2}$. As$_4$H$_x^+$ implant, a 12 keV, $2.5\times10^{15}$ cm$^{-2}$ As$_2$H$_2^+$ implant, or a 6 keV, $5\times10^{15}$ cm$^{-2}$. As$^+$ implant As shown in FIG. 16, the source and drain regions 55 are formed by this implant. These regions provide a high conductivity connection between the circuit interconnects (to be formed later in the process) and the intrinsic transistor defined by the drain extension 48 in conjunction with the channel region 56 and the gate stack 44, 45. The gate electrode 45 can be exposed to this implant (as shown), and if so, the source/drain implant provides the primary doping source for the gate electrode. This is shown in FIG. 17 as the poly doping layer 57.

Figure 18:
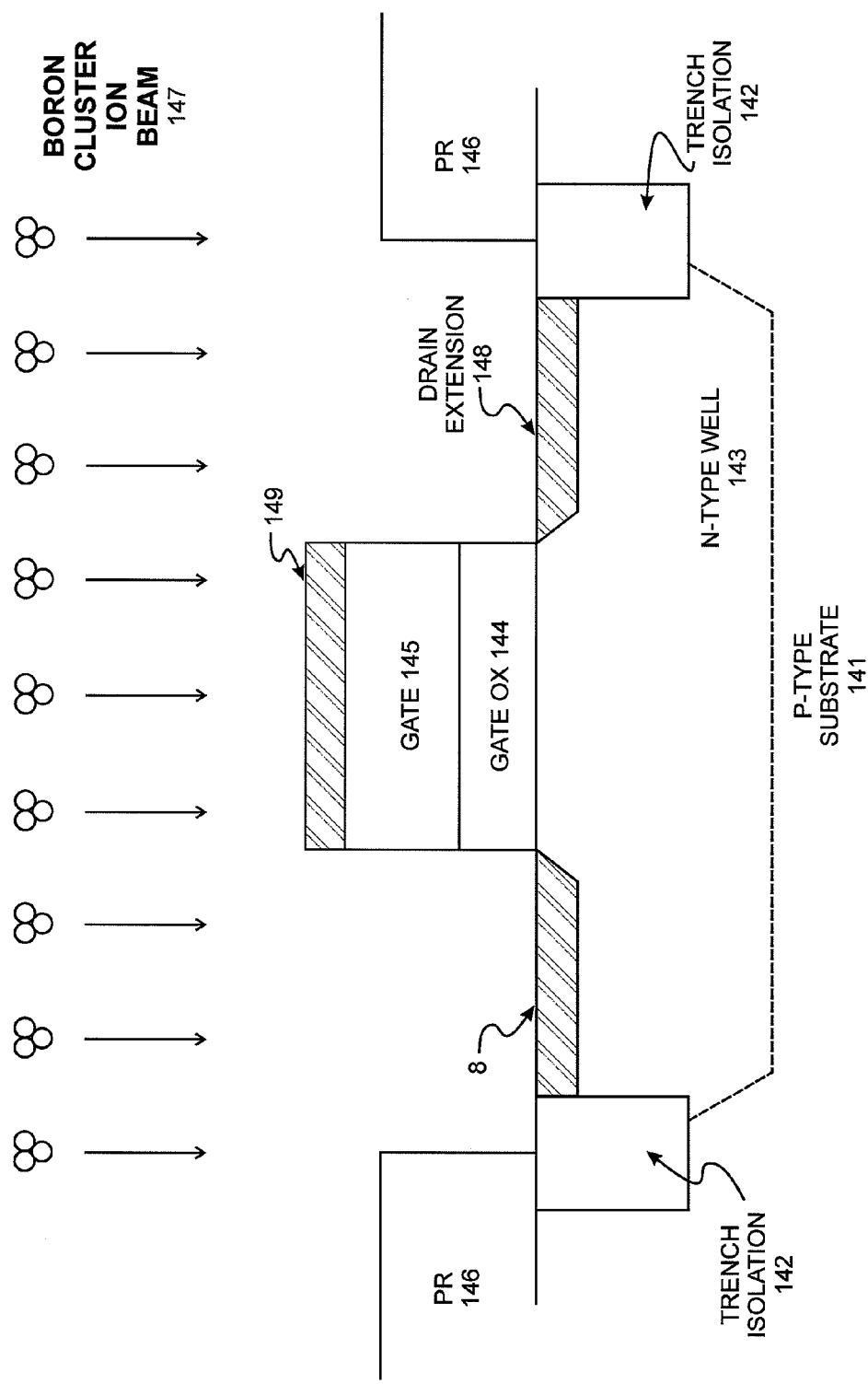
FIG. 18 is a diagram of a semiconductor substrate in the process of manufacturing an PMOS semiconductor device, at the step of P-type drain extension implant.
Figure 19:
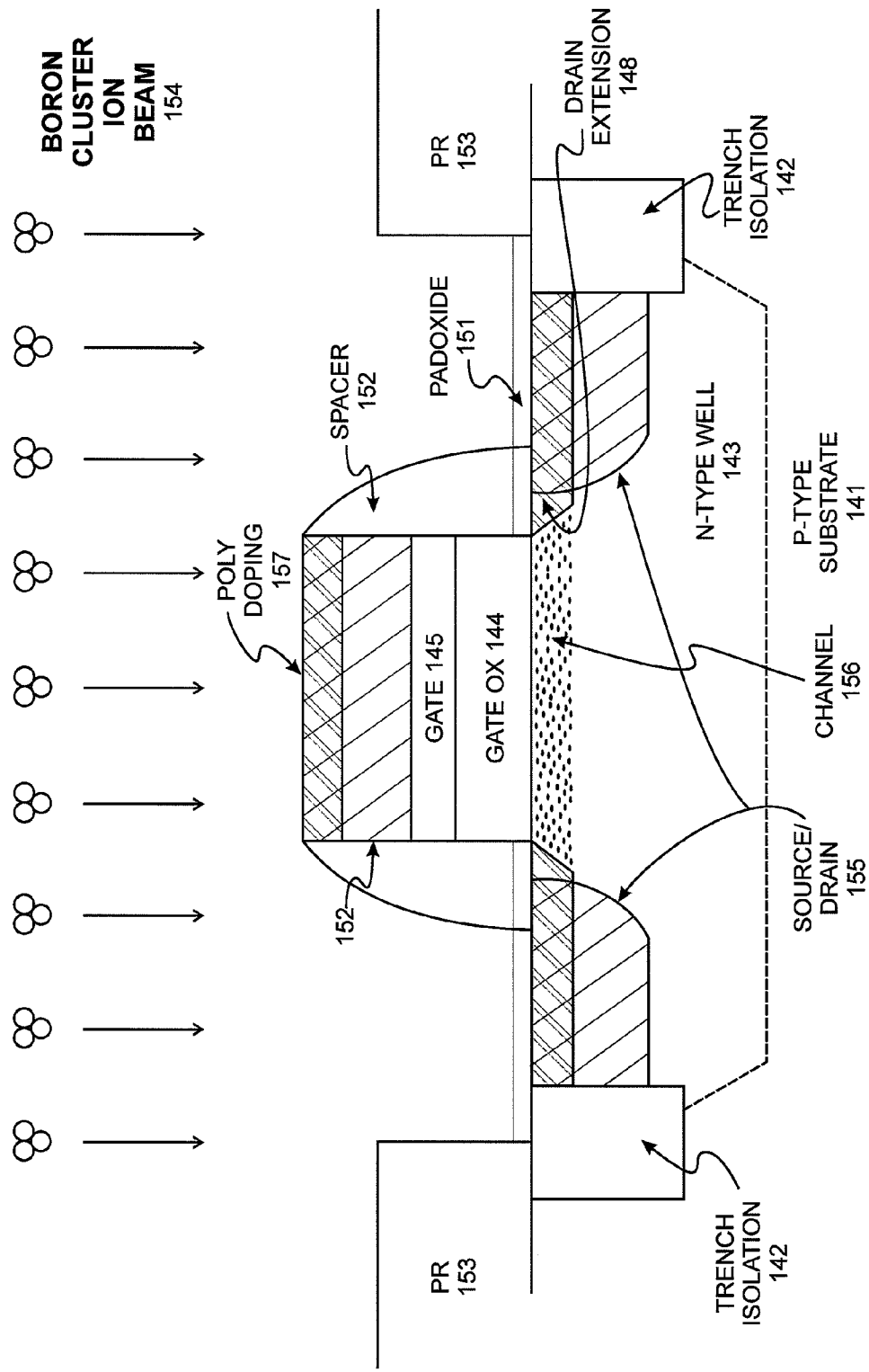
FIG. 19 is a diagram of a semiconductor substrate in the process of manufacturing a PMOS semiconductor device, at the step of the source/drain implant.

The detailed diagrams showing the formation of the PMOS drain extension 148 and PMOS source and drain regions 155 are shown in FIGS. 18 and 19, respectively. The structures and processes are the same as in FIGS. 17 and 18 with the dopant types reversed. In FIG. 18, the PMOS drain extension 148 is formed by the implantation of a boron cluster implant 147. Typical parameters for this implant would be an implant energy of 500 eV per boron atom with a dose of $5\times10^{14}$ cm$^{-2}$, for the 0.13 um technology node. Thus, a B$_{18}$H$_x^+$ implant at 211 AMU would be at 9.6 keV at an octadecaborane dose of $2.8\times10^{13}$ cm$^{-2}$. FIG. 19 shows the formation of the PMOS source and drain regions 148, again by the implantation of a P-type cluster ion beam 154, such as octadecaborane. Typical parameters for this implant would be an energy of around 2 keV per boron atom with a boron dose of $5\times10^{15}$ cm$^{-2}$ (i.e., 38.4 keV octadecaborane at $2.8\times10^{14}$ cm$^{-2}$ for the 0.13 um technology node.

In general, ion implantation alone is not sufficient for the formation of an effective semiconductor junction: a heat treatment is necessary to electrically activate the implanted dopants. After implantation, the semiconductor substrate's crystal structure is heavily damaged (substrate atoms are moved out of crystal lattice positions), and the implanted dopants are only weakly bound to the substrate atoms, so that the implanted layer has poor electrical properties. A heat treatment, or anneal, at high temperature (greater than 900 C) is typically performed to repair the semiconductor crystal structure, and to position the dopant atoms substitutionally, i.e., in the position of one of the substrate atoms in the crystal structure. This substitution allows the dopant to bond with the substrate atoms and become electrically active; that is, to change the conductivity of the semiconductor layer. This heat treatment works against the formation of shallow junctions, however, because diffusion of the implanted dopant occurs during the heat treatment. Boron diffusion during heat treatment, in fact, is the limiting factor in achieving USJ's in the sub-0.1 micron regime. Advanced processes have been developed for this heat treatment to minimize the diffusion of the shallow implanted dopants, such as the "spike anneal". The spike anneal is a rapid thermal process wherein the residence time at the highest temperature approaches zero: the temperature ramps up and down as fast as possible. In this way, the high temperatures necessary to activate the implanted dopant are reached while the diffusion of the implanted dopants is minimized. It is anticipated that such advanced heat treatments would be utilized in conjunction with the present invention to maximize its benefits in the fabrication of the completed semiconductor device.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A vapor source for an ion source, the vapor source comprising:
    a vaporizer body defining a volume for receiving a crucible;
    a conduit in fluid communication with said crucible;
    at least one shut off valve coupled to said conduit;
    a source block formed with a vapor conduit which forms a vapor feed for an ionization chamber; and
    a multiple-stage temperature system for controlling the temperature of said vaporizer body, at least one shut off valve and source block separately.

2. The vapor source as recited in claim 1, wherein said crucible and vaporizer body volume are close-fitting, the gap between them being filled with gas to provide thermal contact between said crucible and vaporizer body volume.

3. The vapor source as recited in claim 2, wherein said gas is at or near atmospheric pressure.

4. The vapor source as recited in claim 2, wherein said gap is separated from vacuum by vacuum seals.

5. The vapor source as recited in claim 1, wherein said multiple-stage temperature control system includes resistive heaters in thermal contact with each of said vaporizer body, at least one shut off valve and said source block, said vapor source also including a multiple-stage temperature controller for controlling said resistive heaters.

6. The vapor source as recited in claim 5, wherein said multiple stage temperature controller is a three stage temperature controller for enabling the temperatures of said vaporizer body, at least one shut off valve and source block to be controlled separately.

* * * * *

UNITED STATES PATENT AND TRADEMARK OFFICE
CERTIFICATE OF CORRECTION

| | |
|---|---|
| PATENT NO. | : 8,618,514 B2 |
| APPLICATION NO. | : 13/287259 |
| DATED | : December 31, 2013 |
| INVENTOR(S) | : Thomas Horsky |

Page 1 of 2

It is certified that error appears in the above-identified patent and that said Letters Patent is hereby corrected as shown below:

In the Drawings

Sheet 30 of 36
Referral Numeral 88, Line 1, Delete "TYEP" and insert -- TYPE --, therefor.
Referral Numeral 91, Line 1, Delete "TYEP" and insert -- TYPE --, therefor.
Fig. 21, Line 4, Delete "3.0" and insert -- 2.0 --, therefor.

In the Specification

Column 2
Line 41, Delete "Enemy" and insert -- Energy --, therefor.

Column 5
Line 40, Delete "triflouride" and insert -- trifluoride --, therefor.

Column 7
Line 27, Delete "$^{11}B+$" and insert -- $^{11}B^+$ --, therefor.

Column 13
Line 57, Delete "triflouride" and insert -- trifluoride --, therefor.

Column 14
Line 29, Delete "electron•impact" and insert -- electron impact --, therefor.
Line 41, Delete "708" and insert -- 70B --, therefor.
Line 42, Delete "718" and insert -- 71B --, therefor.
Line 43, Delete "708" and insert -- 70B --, therefor.
Line 54, Delete "48" and insert -- 4B --, therefor.
Line 55, Delete "58." and insert -- 5B. --, therefor.

Signed and Sealed this
Twenty-ninth Day of July, 2014

Michelle K. Lee
*Deputy Director of the United States Patent and Trademark Office*

Column 16
Line 37, Delete "70." and insert -- 70, --, therefor.
Line 53, Delete "48" and insert -- 4B --, therefor.

Column 17
Line 56, Delete "may.be" and insert -- may be --, therefor.
Line 59, Delete "58" and insert -- 5B --, therefor.
Line 60, Delete "48" and insert -- 4B --, therefor.

Column 18
Line 35, Delete "arid" and insert -- and --, therefor.
Line 66, Delete "em" and insert -- cm --, therefor.

Column 19
Line 5, Delete "a," and insert -- $\sigma$, --, therefor.
Line 15, Delete "ionization." and insert -- ionization --, therefor.

Column 20
Line 3, Delete "SOC" and insert -- 50 C --, therefor.

Column 22
Line 12, Delete "1d." and insert -- 1D. --, therefor.
Line 21, Delete "8b" and insert -- 8B --, therefor.
Line 63, Delete "$cm^2$." and insert -- $cm^{-2}$. --, therefor.

Column 23
Line 48, Delete "Device"." and insert -- Device", attorney docket no. 211843/00030. --, therefor.
Line 63, Delete "$cm^2$." and insert -- $cm^{-2}$. --, therefor.

Column 24
Line 40, Delete "μrn" and insert -- μm --, therefor.
Line 43, Delete "$As_2H_2^+$" and insert -- $As_2H_x^+$ --, therefor.
Line 44, Delete "As" and insert -- as --, therefor.